United States Patent [19]
Chapman

[11] Patent Number: 6,128,767
[45] Date of Patent: Oct. 3, 2000

[54] POLYGON REPRESENTATION IN AN INTEGRATED CIRCUIT LAYOUT

[76] Inventor: David C. Chapman, 2655 Keystone Ave., Suite 41, Santa Clara, Calif. 95051

[21] Appl. No.: 08/960,715

[22] Filed: Oct. 30, 1997

[51] Int. Cl.$^7$ .................................................. G06F 17/50
[52] U.S. Cl. .................................................. 716/1; 716/11
[58] Field of Search .................... 395/500.03, 500.06, 395/500.12; 716/2, 5, 11, 3

[56] References Cited

U.S. PATENT DOCUMENTS

| | | | |
|---|---|---|---|
| 5,097,422 | 3/1992 | Corbin, II et al. | 364/491 |
| 5,113,451 | 5/1992 | Chapman et al. | 382/8 |
| 5,416,722 | 5/1995 | Edwards | 395/500.03 |
| 5,515,293 | 5/1996 | Edwards | 364/489 |
| 5,581,475 | 12/1996 | Majors | 364/491 |
| 5,612,893 | 3/1997 | Hao et al. | 395/500.03 |
| 5,613,102 | 3/1997 | Chiang et al. | 395/500.06 |
| 5,625,568 | 4/1997 | Edwards et al. | 395/500.03 |
| 5,640,497 | 6/1997 | Woolbright | 395/133 |
| 5,689,433 | 11/1997 | Edwards | 395/500.03 |

FOREIGN PATENT DOCUMENTS

3935418A1  4/1990  Germany .

OTHER PUBLICATIONS

W. L. Schiele, Th. Krüger, K.M. Just, F.H. Kirsch, *A Gridless Router for Industrial Design Rules*, Siemens AG, Semiconductor Group, HL CAD, 27th ACM/IEEE Design Automation Conference, Paper 38.1 1990 no page #.

Xue–Hou, Tan, et al, "Reporting Intersections of C–Oriented Polygons", Transactions of the Institute of Electronics, Information and Communication Engineers, vol. E 73, No. 11, Nov. 1990, pp. 1886–1892, XP–002099144, ISSN 0913–574X, Japan, see p. 1886, col. 1, line 1, p. 1888, col. 1, line 10.

Fokkema, J. T., et al., An Efficient Datastructure and Algorithm for VLSI Artwork Verification, Proceedings IEEE International Conference on Computer Design: VLSI in Computers (ICCD '83), Port Chester, NY, USA, Oct. 31–Nov. 3, 1983, pp. 350–353, XP002099145, ISBN 0–8186–0480–8, 1983, Silver Spring, MD, USA, IEEE Comput. Soc. Pres, USA, see p. 350, col. 1, line 1–p. 350, col. 2, line 6.

(List continued on next page.)

*Primary Examiner*—Paul R. Lintz
*Assistant Examiner*—Leigh Marie Garbowski
*Attorney, Agent, or Firm*—Hickman Palermo; Truong & Becker, LLP; Edward A. Becker

[57] ABSTRACT

An approach for representing polygons in an integrated circuit (IC) layout is provided. Polygons are represented by one or more wires, which in turn are each represented by one or more wire segments. Each wire segment is represented by a pair of directed line segments. A data structure hierarchy includes polygon data, wire data, wire segment data and branch data. The polygon data represents a set of IC devices to be represented in the IC layout. The wire data represents the wires that represent the polygons and specifies the associated wire segments and associated polygons. The wire segment data represents the wire segments and specifies the associated directed line segments for each wire segment that represent the wires and references the wire data. The branch data specifies connections between wires by specifying the connecting wire segments in the wires. A spacing check between a first polygon and a second polygon involves determining the canonical direction from the first polygon to the second polygon and testing the two closest faces between the polygons. To satisfy a spacing violation, an exclusion zone is constructed around the first polygon and the second polygon is moved a distance outside the exclusion zone which causes the minimum spacing required by a set of predetermined spacing criteria to be satisfied.

33 Claims, 19 Drawing Sheets

OTHER PUBLICATIONS

Baird, Henry S., "Fast Algorithms for LSI Artwork Analysis" Proceedings of the 14$^{th}$ Design Automation Conference, New Orleans, LA, USA, Jun. 1977, vol.2, No. 2, pp. 179–209, XP002100128, ISSN 0099–1708, Journal of Design Automation & Fault–Tolerant Computing, May 1978, USA.

Mohan Guruswamy, Robert L. Maziasz, Daniel Dulitz, Srilata Raman, Venkat Chiluvuri, Andrea Fernandez and Larry G. Jones, "CELLERITY: A Fully Automatic Layout Synthesis System for Standard Cell Libraries," 1997, Unified Design System Laboratory, Motorola, Inc. no pg #.

Donald G. Baltus, Thomas Varga, Robert C. Armstrong, John Duh and T.G. Matheson, "Developing A Concurrent Methodology For Standard–Cell Library Generation," 1997, Mentor Graphics Corporation, no pg #.

Martin Lefebvre, David Marple and Carl Sechen, "The Future of Custom Cell Generation in Physical Synthesis," 1997, Design Automation Conference, no pg #.

John Lakos, "Technology Retargeting For IC Layout," 1997, Mentor Graphics Corporation, no pg #.

David Marple, Michiel Smulders and Henk Hegen, "An Efficient Compactor for 45°Layout," Philips Research Laboratories, no date no pg #.

Stephen M. Trimberger, "An Introduction to CAD for VLSI," VLSI Technology, Inc., no date no pg #.

Johannes Waterkamp, Rainer Wicke, Rainer Brück, Michael Reinhardt and Georg Schrammeck, "Technology Tracking of Non Manhattan VLSI Layout," 1989, 26th ACM/IEEE Design Automation Conference, no pg #.

Bertrand P. Serlet, "Fast, Small, and Static Combinational CMOS Circuits," 1987, Xerox PARC Computer Science Laboratory, 24th ACM/IEEE Design Automation Conference, no pg #.

Chi Yi Hwang, Yung–Ching Hsieh, Youn–Long Lin and Yu–Chin Hsu, "An Efficient Layout Style for Two–Metal CMOS Leaf Cells and Its Automatic Synthesis," IEEE Transactions on Computer–Aided Design of Integrated Circuits and Systems, vol. 12, No. 3, Mar. 1993, no pg #.

Chong–Leong Ong, Joeong–Tyng Li and Chi–Yuan Lo, "GENAC: An Automatic Cell Synthesis Tool," AT&T Bell Laboratories, 1989, 26th ACM/IEEE Design Automation Conference, no pg #.

Charles J. Poirier, "Excellerator: Custom CMOS Leaf Cell Layout Generator," 1989 IEEE, no pg #.

Shmuel Wimer, Ron Y. Pinter and Jack A. Feldman, "Optimal Chaining of CMOS Transistors in a Functional Cell," IEEE Transactions on Computer–Aided Design, vol. CAD–6, No. 5, Sep. 1987, no pg #.

Chao C. Chen and Shau–Lim Chow, "The Layout Synthesizer: An Automatic Netlist–to–Layout System," Cadence Design Systems, Inc., 1989, 26th ACM/IEEE Design Automation Conference, no pg #.

Stan Chow, Hungsen Chang, Jimmy Lam and Youlin Liao, "The Layout Synthesizer: An Automatic Block Generation System," Cadence Design Systems, IEEE 1992 Custom Integrated Circuits Conference, no pg #.

Thomas Revesz, "Clipping Polygons with Sutherland–Hodgman's Algorithm," The C Users Journal—Aug. 1993, no pg #.

*Fig. 4A* 400 →
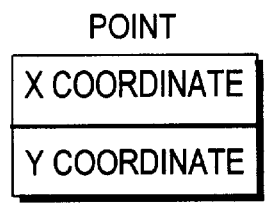
*Fig. 4B* 410 →
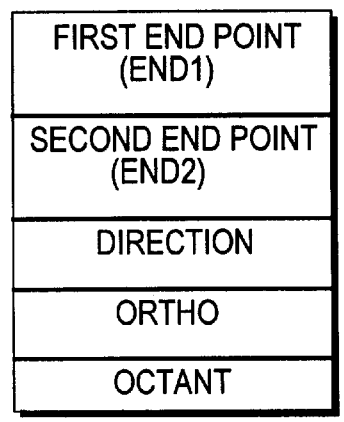
*Fig. 4C* 420 →
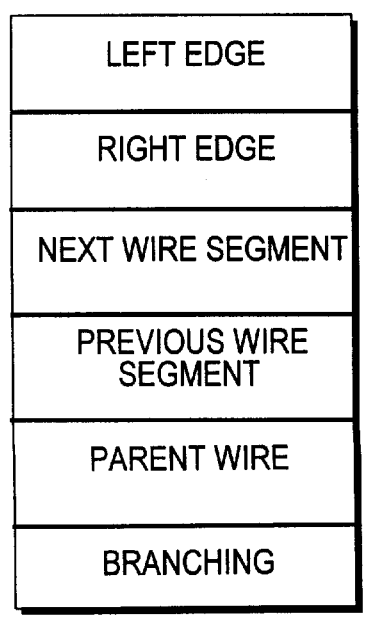

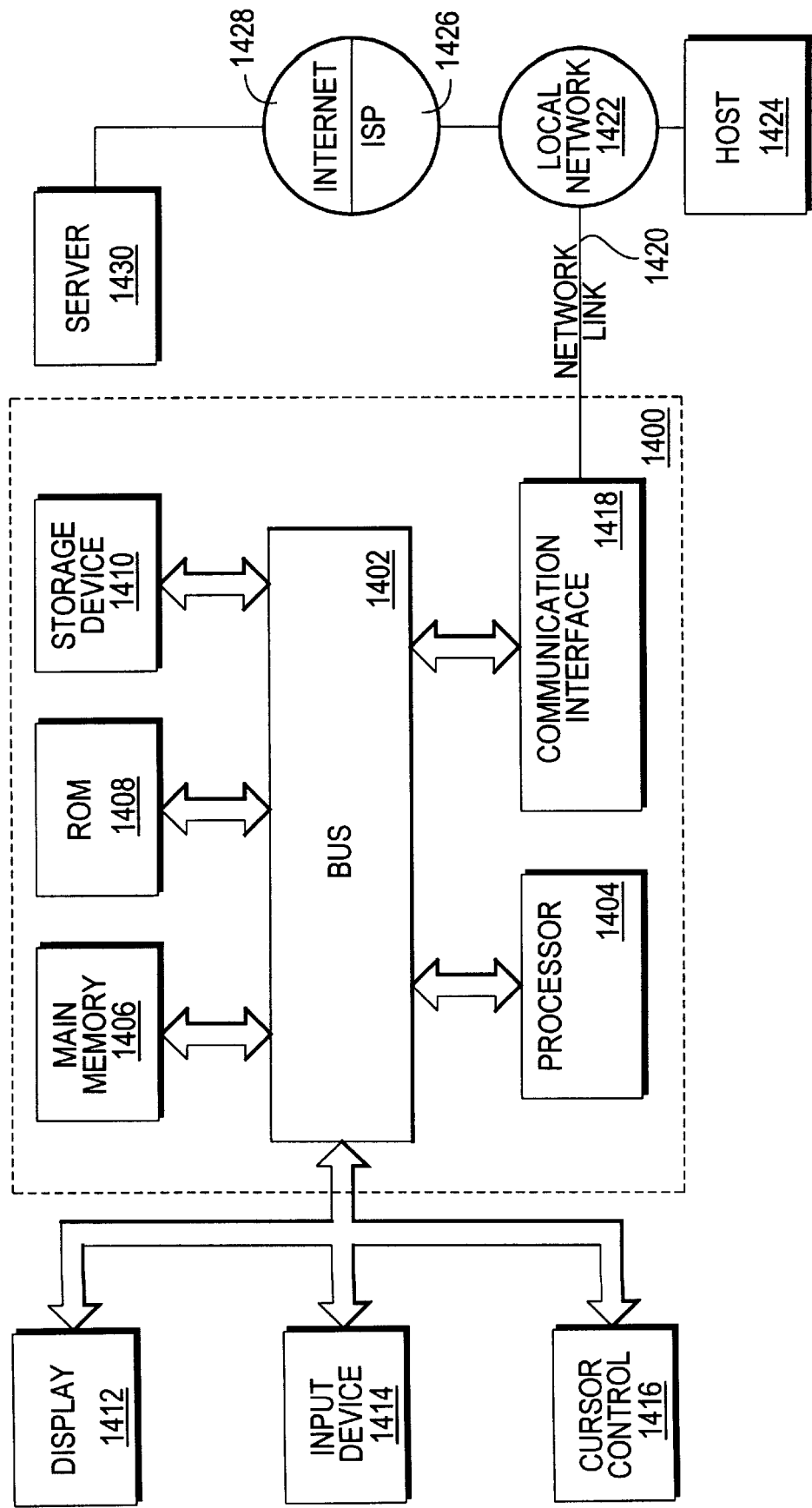

POLYGON REPRESENTATION IN AN INTEGRATED CIRCUIT LAYOUT

FIELD OF THE INVENTION

The invention relates to the design of integrated circuits, and more specifically, to a method and apparatus for representing polygons in an integrated circuit layout.

BACKGROUND OF THE INVENTION

In the context of integrated circuit (IC) design, a "layout" is a set of geometric patterns, typically in the form of polygons, which specify the size and location of different types of material used to create semiconductor devices and electrical connections between the devices during the fabrication of an IC. For example, a diffusion window on an IC may be represented in a layout by one or more polygons which are interpreted by a fabrication facility to mean "diffusion layer geometry." Other layers of material and features, such as contacts and vias, may be similarly represented in an IC layout. The polygons in an IC layout must satisfy a set of design rules that defines minimum sizes for certain types of material as well as minimum spacing requirements between different types of material. The set of design rules also specifies size and spacing requirements for other layout features such as contacts.

Sometimes, IC layouts are drawn by hand using a computer aided design (CAD) system. This approach is often adequate for designing IC layouts having a relatively small number of devices. However, modern fabrication technology allows several million transistors to be placed on a single silicon substrate. Drawing an IC layout by hand that contains millions of transistors is not practical because of the excessive time required, even if standardized cells are used to reduce the number of individual transistors that must be drawn. Consequently, various computer-based IC layout design tools have been developed to automate the generation of IC layouts. Two types of layout design tools include leaf cell compaction tools and leaf cell synthesis tools. In the context of IC layouts, the term "leaf cell" refers to a group of transistors, typically from two to several hundred, that together perform a specific function, such as a NAND logical operation or storing a bit of information.

Leaf cell compaction tools are used to reduce the size of an existing IC layout. Most leaf cell compaction tools compact a layout in either the vertical or horizontal direction by eliminating extra space between polygons. "Full" compaction is sometimes provided by first compressing a layout in the horizontal direction and then compressing the layout in the vertical direction. However, most leaf cell compaction tools are also able to adjust the coordinates of the polygon points in an IC layout until they meet the design rules for a particular fabrication process, making them helpful for porting an existing layout from a current set of design rules to a new set of design rules. Despite the benefits of leaf cell compaction tools, even a compacted layout is larger than comparable hand-drawn cells because compaction is generally a one-dimensional process. Also, compaction tools maintain the existing layout structure even though non-linear changes in design rules (e.g. proportionately increased metal overlap around a contact) often cause human layout designers to make different decisions when they draw layout in these new design rules.

In contrast to leaf cell compaction tools, leaf cell synthesis tools have the capability to generate a new leaf cell layout based upon a transistor-level netlist that specifies the size of transistors and the electrical connections between the transistors. Because a layout synthesis system does not need to maintain an existing layout structure, it can take full advantage of the design rules or circuit requirements, e.g. by reordering transistors, placing transistors in alternating rows, or reallocating routing where resources become available. Many layout synthesis systems use compaction as a final step in generating a layout, but they can still generate more compact layouts than their counterparts that only compact existing layouts.

Most IC layout design tools generate an internal representation of the polygons contained in a layout. Two approaches for representing polygons in an IC layout include the general polygon approach and the wire or path approach.

The general polygon approach uses a single list of points that represents rectangles or trapezoids used to construct the polygons contained in an IC layout. Each rectangle or trapezoid has parallel sides with the same orientation and is defined by four points. Complex polygons are represented by placing multiple trapezoids adjacent to each other. The general polygon approach is arbitrary and provides the flexibility to represent any layout geometry. There is no preferred orientation or "winding direction" in the trapezoids. That is, a trapezoid is not referenced with respect to a particular corner and the sides of a trapezoid are not ordered e.g. with respect to current flow. However, the arbitrary nature makes the general polygon approach difficult to implement in software. Because most synthesis software limits the number of points that can be contained in a single polygon, some complex polygons containing numerous trapezoids must be fractured into smaller polygons. The need to fracture a polygon into many trapezoids or rectangles obscures its purpose, and it is difficult to determine useful properties such as resistance or transistor device size. Also, relatively simple changes in the polygons can result in wholesale restructuring of the trapezoid representation. Many tools use only rectangles because the algorithms required to manipulate non-orthogonal geometry built from trapezoids are complex. Large quantities of trapezoids or rectangles are required to represent all but the simplest polygons, and useful operations like inserting a bend in a wire are difficult because they have no direct analog in a list of concatenated trapezoids. Finally, some implementations of the general polygon approach represent the entire design space, including any unused space between polygons, which increases the polygon count and requires more data to represent the layout.

The wire or path approach represents polygons using a center line and a polygon width for each point along the center line. The simplicity of this approach is easily implemented in synthesis tools and can simplify routing between diffusion islands. Also, the width and resistance of a path can be easily calculated. Most layout geometry can be represented without concatenating wires or placing wires next to each other, and this approach is used in many routing tools. However, the path approach requires that polygons have parallel sides, which makes it unsuitable for more complex shapes, such as octagon-shaped contacts, irregular-shaped diffusion islands, or wires that vary in width.

In view of the need to represent polygons in IC layout synthesis tools and the limitations in existing approaches, an alternative approach for representing polygons in an IC layout is highly desirable.

SUMMARY OF THE INVENTION

According to one aspect of the invention, an approach is provided for generating a data representation of an IC layout. The computer system comprises a memory and one or more processors coupled to the memory. The memory contains a set of instructions which, when executed by the one or more processors, cause the one or more processors to perform several steps. First, polygon data associated with a polygon that represents a set of IC devices to be represented by the IC layout is generated, where the polygon is represented by one or more wires. Then, wire data is generated that both represents the one or more wires and contains at least one reference to the polygon data, where each wire is represented by one or more wire segments. Wire segment data is generated that both represents the one or more wire segments for each wire and contains at least one reference to the wire data. At least one reference in the polygon data is generated that references the wire data. Finally, at least one reference in the wire data is generated that references the wire segment data.

According to another aspect of the invention, an approach for performing a validity check of the polygon data is provided. First, a first polygon and a second polygon are selected from one or more polygons to be checked. Then, the canonical direction from the first polygon to the second polygon is determined. Finally, based upon the canonical direction from the first polygon to the second polygon, a determination is made as to whether the space in between the first polygon and the second polygon satisfies a set of predetermined spacing criteria. If the spacing between the first polygon and the second polygon does not satisfy the set of predetermined spacing criteria, then the second polygon is moved with respect to the first polygon in a direction that is opposite from the direction of the two sides of the first polygon that are closest to the second polygon.

BRIEF DESCRIPTION OF THE DRAWINGS

Embodiments of the invention are illustrated by way of example, and not by way of limitation, in the figures of the accompanying drawings and in which like reference numerals refer to similar elements and in which:

FIG. 4A illustrates a point data structure according to an embodiment of the invention;

FIG. 4B illustrates a directed line segment data structure according to an embodiment of the invention;

FIG. 4C illustrates a wire segment data structure according to an embodiment of the invention;

FIG. 14 is a block diagram of a computer system on which embodiments of the invention may be implemented.

DETAILED DESCRIPTION OF THE PREFERRED EMBODIMENT

A novel approach for representing polygons in an IC layout is described. In the following description, for the purposes of explanation, specific details are set forth in order to provide a thorough understanding of the invention. However, it will be apparent that the invention may be practiced without these specific details. In other instances, well-known structures and devices are depicted in block diagram form in order to avoid unnecessarily obscuring the invention.

Functional Overview

Generally, according to an embodiment of the invention, the polygons of an IC layout are represented by one or more wires that are each represented by one or more wire segments. Each wire segment is formed from a pair of directed line segments. A novel data structure hierarchy is provided for maintaining data that represents the wires, wire segments and directed line segments. The data structure hierarchy is used during IC layout synthesis to perform validity checks on the IC layout.

Detailed Description

1) Canonical Orientation.

Figure 1:
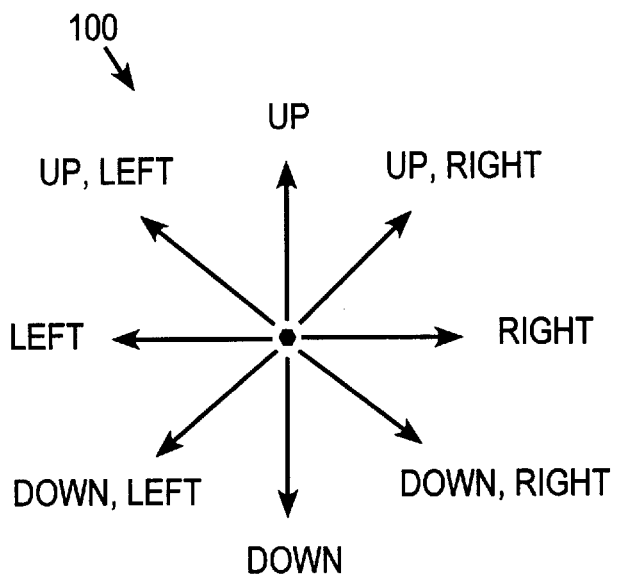
FIG. 1 illustrates a canonical orientation according to an embodiment of the invention.

As illustrated in FIG. 1, canonical orientation refers generally to the direction of IC layout geometry with respect to a predetermined orientation key 100. According to one embodiment of the invention, IC layout geometry may be oriented in one of eight canonical orientations, each canonical orientation representing a multiple of 45°. Starting at the top of orientation key 100 and proceeding clockwise, the canonical orientations include (up), (up, right), (right), (down, right), (down), (down, left), (left) and (up, left).

Figure 2:
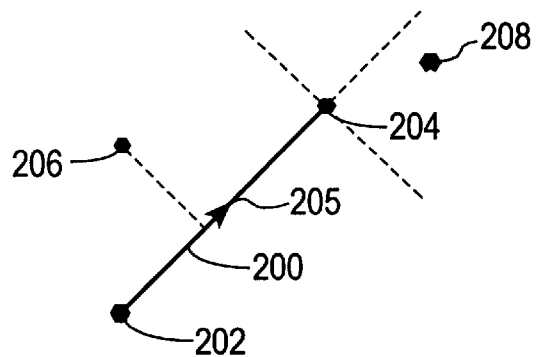
FIG. 2 illustrates a directed line segment and adjacent point according to an embodiment of the invention.

In addition to IC layout geometry being oriented in a canonical orientation, the relationship between IC layout features is also described in terms of a canonical direction. For example, as illustrated in FIG. 2, a line segment 200 is defined by end points 202 and 204. According to an embodiment of the invention, the canonical orientation of line segment 200 is based upon the position of end point 204 with respect to the end point 202. Thus, line segment 200 is oriented or directed in the (up, right) direction, as indicated by direction arrow 205. There are no restrictions on the direction in which a line segment may point. For example, if end point 204 is below and left of end point 202, then the canonical orientation of line segment 200 would be (down, left). In addition, point 206 is positioned to the left (left) of line segment 200 while point 208 is positioned up and to the right (up, right) of line segment 200. This approach is useful for determining whether the spacing between line segment 200 and point 206 satisfies a set of predetermined spacing criteria as described hereinafter.

As previously introduced, IC layout polygons are represented by one or more wires and each wire is represented by one or more wire segments. According to an embodiment of the invention, each wire segment has four sides, two side faces (left and right) and two end faces (first and second). The side faces are represented by a pair of directed edges that are oriented substantially in the same direction, but which are not required to be parallel or have coincident endpoints. According to one embodiment of the invention, the left and right faces must each be at a multiple of a 45° angle with respect to each other, but the end faces may be at any angle with respect to each other. Generally, the end faces will be at a multiple of 45° at the exposed ends of the wire while "internal" end faces may be at any angle. As with line segments, wire segments may point in any direction as previously described with reference to FIG. 1. According to one embodiment of the invention, all points on a wire segment may not be coincident to ensure that each face has a non-zero length and a defined direction.

Figure 3:
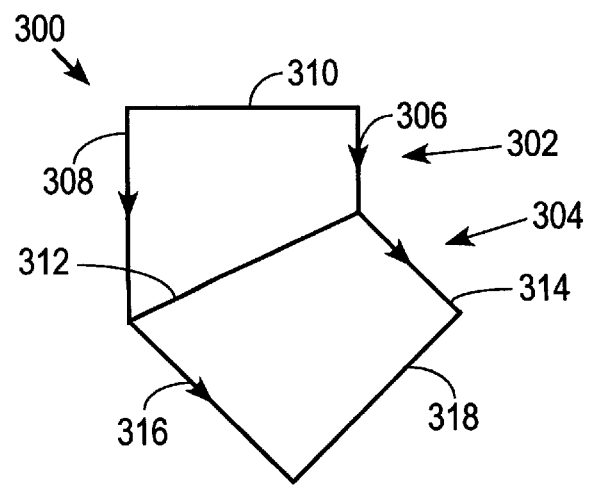
FIG. 3 illustrates a wire according to an embodiment of the invention.

FIG. 3 illustrates a wire 300 that is constructed from a wire segment 302 and a wire segment 304 that is joined to wire segment 302 at a 45° angle according to an embodiment of the invention. Wire segment 302 is constructed from a first directed edge 306, that constitutes the left face of wire segment 302, and a second directed edge 308 that constitutes the right face of wire segment 302. Wire segment 302 also includes a first end face 310 and a second end face 312. Both directed edges 36 and 38 point in the (down)direction. Hence, wire segment 302 also points in the (down) direction.

Wire segment 304 is constructed from a first directed edge 314 and a second directed edge 316. Both directed edges 314, 316 are oriented in the (down, right) direction, thus making wire segment 304 oriented in the (down, right) direction. Wire segment 304 includes a first end face 312 that is coincident with the second end face of wire segment 302, and a second end face 318.

2) Data Structures

According to an embodiment of the invention, a novel data structure architecture is provided for representing polygons in a IC layout as illustrated by FIGS. 4A–4G. According to one embodiment of the invention, each polygon in an IC layout is represented by one or more wires. Each wire is represented by one or more wire segments that is each represented by a pair of directed line segments. Each wire segment references the wire in which it is contained and each wire references a polygon in which it is contained. Thus, given a reference to a single wire segment, an entire polygon may be located and manipulated.

FIG. 4A illustrates the context of a point data structure 400 according to an embodiment of the invention. Point data structure 400 specifies the location of a point in an IC layout by specifying X and Y coordinates (X COORDINATE, Y COORDINATE) for a point on an IC layout.

FIG. 4B illustrates the contents of a directed line segment data structure 410. Directed line segment data structure 410 specifies both a first end point (END1) and a second end point (END2) of the corresponding directed line segment. Directed line segment data structure 410 also specifies a direction (DIRECTION) of a directed line segment. As previously described, a directed line segment may be directed in any one of eight pre-defined directions as illustrated in FIG. 1.

Directed line segment data structure 410 also specifies an ortho flag (ORTHO) and an octant flag (OCTANT). The ortho flag is a BOOLEAN flag that indicates whether a directed line segment is directed at an angle that is a multiple of 90° while the octant flag is a BOOLEAN flag that specifies whether a directed line segment is directed at an angle that is a multiple of 45°. According to one embodiment of the invention, if neither the ortho nor octant flags are set, then the directed line segment is oriented at a "odd" angle, i.e. other than 45° or 90°, that in some circumstances requires floating point arithmetic to compute coordinates of the directed line segment.

FIG. 4C illustrates the contents of a wire segment data structure 420 that specifies a left edge (left EDGE) and a right edge (right EDGE) of a wire segment. Both the left edge and the right edge each reference a directed line segment data structure 410. Wire segment data structure 420 also includes a reference to the next wire segment (NEXT WIRE SEGMENT) and the previous wire segment (PREVIOUS WIRE SEGMENT) in the wire, forming a doubly linked list. The wire segment data structure for the first wire segment in a wire specifies a predetermined value to indicate that the wire segment does not reference a previous wire segment. According to one embodiment of the invention, a NULL value is used as the predetermined value. Similarly, the wire segment data structure for the last wire segment in a wire specifies a predetermined value to indicate that the wire segment does not reference a next wire segment. Although an embodiment of wire data structure 420 is described in the context of a doubly linked list, a doubly linked list is not required.

Wire segment data structure 420 also contains a reference to a parent wire (PARENT WIRE) that contains the wire segment as well as a reference (BRANCHING) to a branching data structure which is relevant if an exposed end face of the current wire segment touches a side face of another wire to form a branch. The contents of a branching data structure are described hereinafter. Branching data structures are not allocated to wire segments that do not have branching, in order to save memory.

Figure 4D:
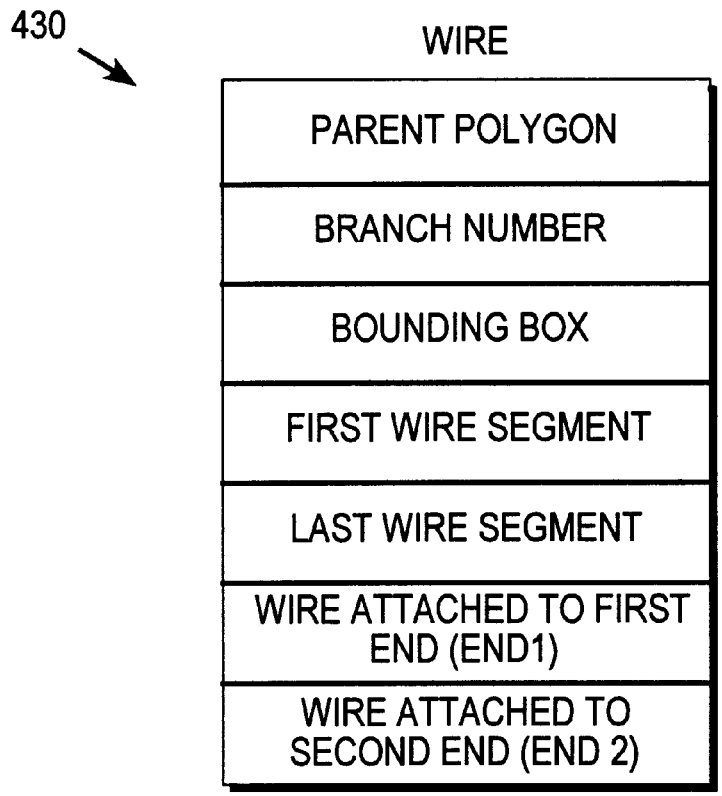
FIG. 4D illustrates a wire data structure according to an embodiment of the invention.

FIG. 4D illustrates the contents of a wire data structure 430. Wire data structure 430 specifies a reference to a parent polygon (PARENT POLYGON) as well as a branch number (BRANCH NUMBER) that identifies the wire. Wire data structure 430 also species a bounding box (BBX) that encompasses all of the wire segments of the wire. A bounding box allows quick region query checks such that even if a wire is returned by a region query, if no wire segment in it is close enough to the query point, then no segment in the wire need to be checked. According to one embodiment of the invention, a bounding box (BBX) is implemented as four integers corresponding to the left, bottom, right and top coordinates of the bounding box.

Wire data structure 430 also includes a reference to the first wire segment (FIRST WIRE SEGMENT) and the last wire segment (LAST WIRE SEGMENT) in the wire as well as a reference to a wire attached to the first end (WIRE ATTACHED TO FIRST END) and a wire attached to the second end (WIRE ATTACHED TO SECOND END).

Figure 4E:
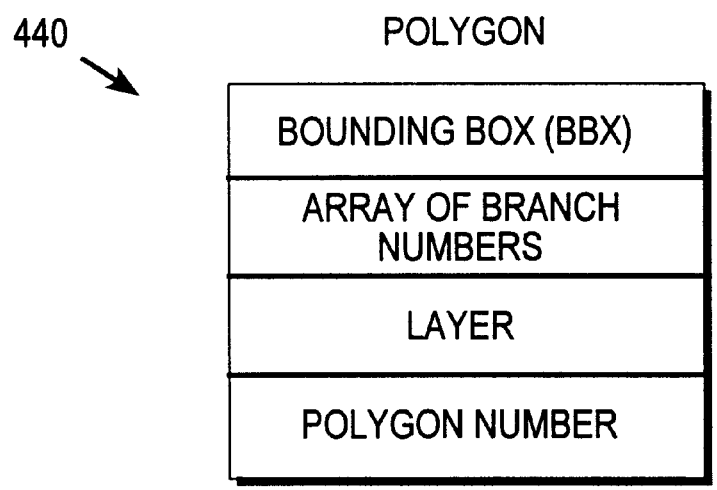
FIG. 4E illustrates a polygon data structure according to an embodiment of the invention.

FIG. 4E illustrates the contents of a polygon data structure 440 that specifies a bounding box (BBX) and an array of branch numbers (ARRAY OF BRANCH NUMBERS) that specifies all of the member wires of a polygon by branch number, as previously described with respect to wire data structure 430. According to one embodiment of the invention, polygon data structure 440 also includes a reference to the corresponding process layer (LAYER) for the polygon as well as a polygon number (POLYGON NUMBER) used to uniquely identify the polygon. For example, this information may be used with a list that specifies all of the polygons for a particular process layer.

Figure 4F:
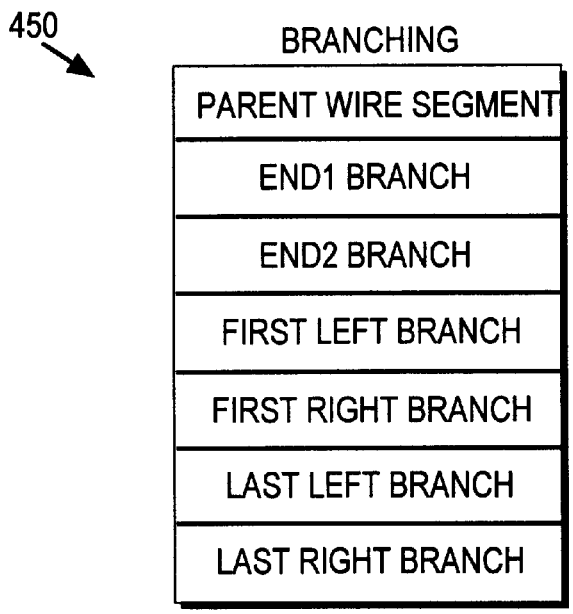
FIG. 4F illustrates a branching data structure according to an embodiment of the invention.

FIG. 4F illustrates the contents of a branching data structure 450 used when a branch is formed in a polygon according to an embodiment of the invention. A branch is formed when an exposed end face of a wire segment touches a side face of another wire. Branching data structure 450 specifies a reference to the parent wire segment (PARENT WIRE SEGMENT) as well as references to other wire segments which are attached to the first (END1 BRANCH) and second (END2 BRANCH) ends of the wire segment respectively. Branching structure 450 also includes a reference to the first and last left branches (FIRST left BRANCH, LAST left BRANCH) and first and last right branches (FIRST right BRANCH, LAST right BRANCH) from a wire segment. That is, these data structure elements reference a side branching structure when a particular wire segment has other wire segments which intersect with that wire segment on one of its sides. According to an embodiment of the invention, any number of branches may be attached to a side face of a wire segment, but the end face of a wire may be attached to only one other wire segment.

Figure 4G:
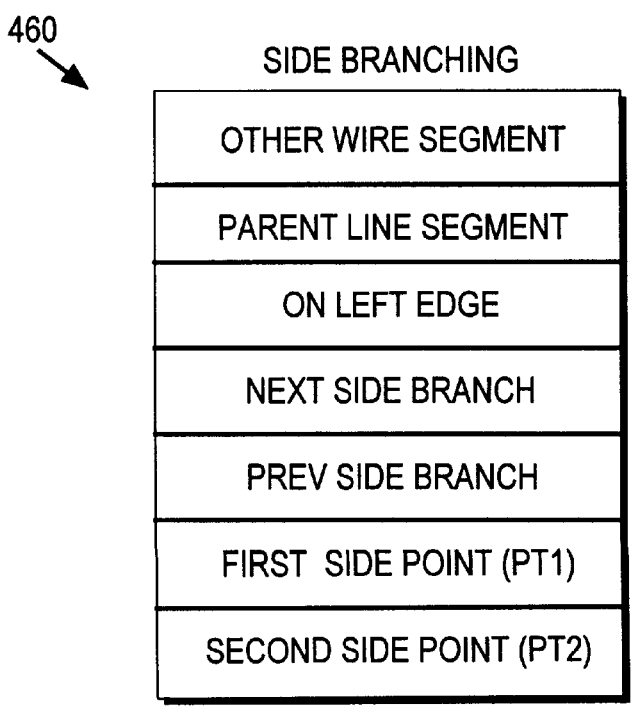
FIG. 4G illustrates a side branching data structure according to an embodiment of the invention.

FIG. 4G illustrates the contents of a side branching structure 460 that specifies a reference to a wire segment (OTHER WIRE SEGMENT), which is part of the branch attached to the parent wire segment as well as the line segment (PARENT LINE SEGMENT) in the parent wire segment to which the other wire segment is attached. Side branching structure 460 also specifies whether the other wire segment attaches on the left side of the parent wire segment based upon a BOOLEAN flag (ON left EDGE). Side branching structure 460 also includes a reference to the next side branch (NEXT SIDE BRANCH) and previous side branch (PREV SIDE BRANCH) data structures as well as the first side point (FIRST SIDE POINT) and second side point (SECOND SIDE POINT) that specify the locations on the parent wire segment where the other wire segment attaches. The side points aid in sorting the side branch lists; the first side point is closer to end1 of the parent wire segment.

Figure 5:
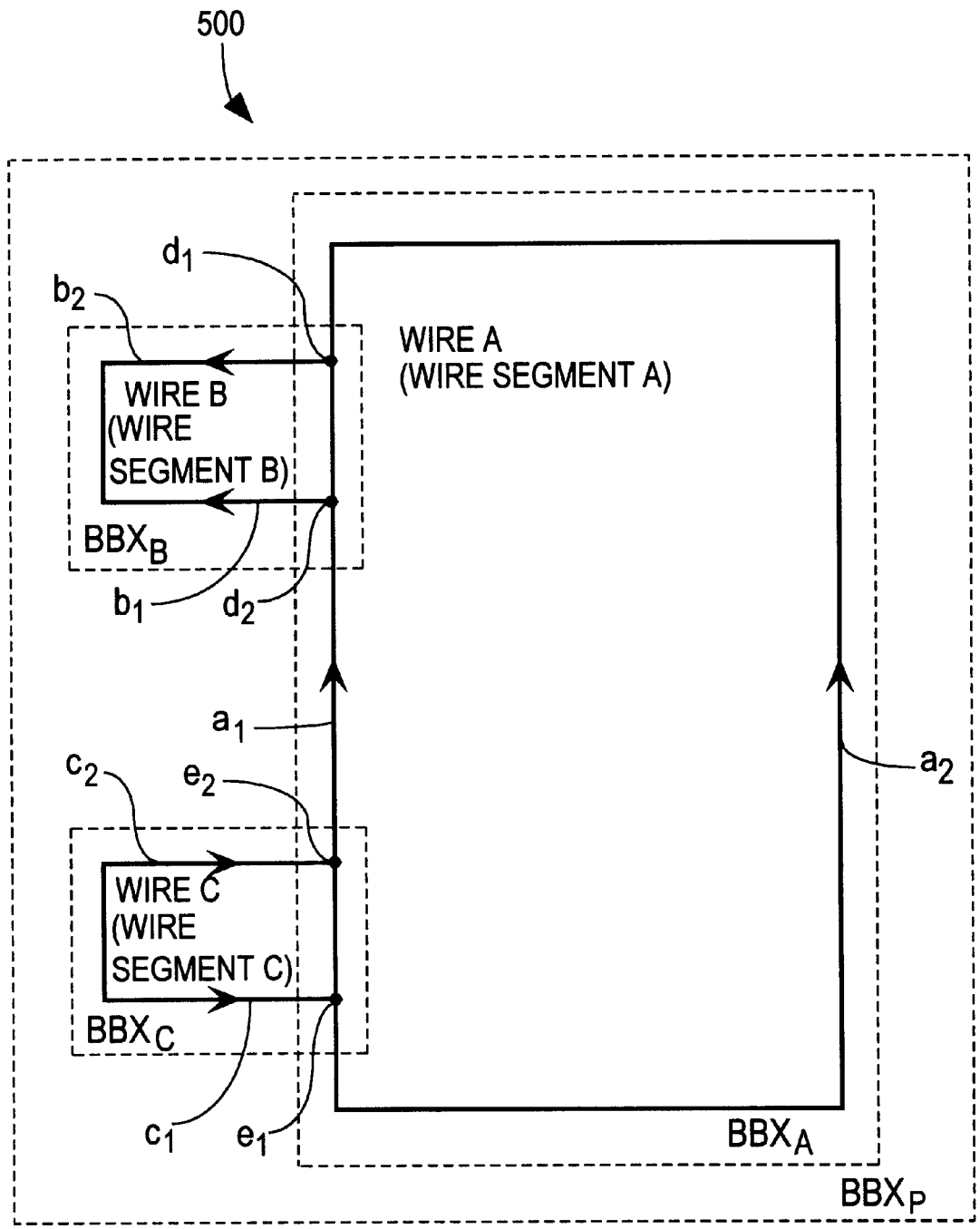
FIG. 5 illustrates a polygon constructed from wire segments according to an embodiment of the invention.

The aforementioned data structures are now described with reference to FIG. 5 and a polygon 500 constructed from three wires, WIRE A, WIRE B and WIRE C, according to an embodiment of the invention. Each wire, WIRE A, WIRE B and WIRE C, consists of a single wire segment identified as WIRE SEGMENT A, WIRE SEGMENT B and WIRE SEGMENT C.

WIRE SEGMENT A is constructed from two directed line segments $a_1$ and $a_2$ that are both directed in the (up) direction, as indicated by the direction arrows. WIRE SEGMENT B is constructed from directed line segments $b_1$ and $b_2$ that are both directed in the (left) direction. WIRE B is joined with WIRE A at directed line segment $a_1$ at a location defined by points $d_1$ and $d_2$. WIRE SEGMENT C is constructed from directed line segments $c_1$ and $c_2$ that are both directed in the (right) direction. WIRE C joins WIRE A on directed line segment a, at a location defined by points $e_1$ and $e_2$. Bounding boxes $BBX_A$, $BBX_B$, $BBX_C$ define the contents of WIRE A, WIRE B and WIRE C, respectively, and bounding box $BBX_P$ defines the contents of polygon 500.

According to one embodiment of the invention, all of the wires in a polygon share a logical association. For example, for a particular polygon, all of the wires may be physically contiguous and share electrical characteristics. For another polygon, the wires may not share a physical association, but may be electrically connected, for example in the case of a group of contacts. On the other hand, a set of wires may be logically grouped into one polygon because of the convenience of having those wires share a single polygon. For example, even though not physically or electrically associated, all of the polysilicon gates on a diffusion island may be included in a single polygon because of the convenience of manipulating all of the polysilicon gates on a diffusion island together.

Figure 6A:
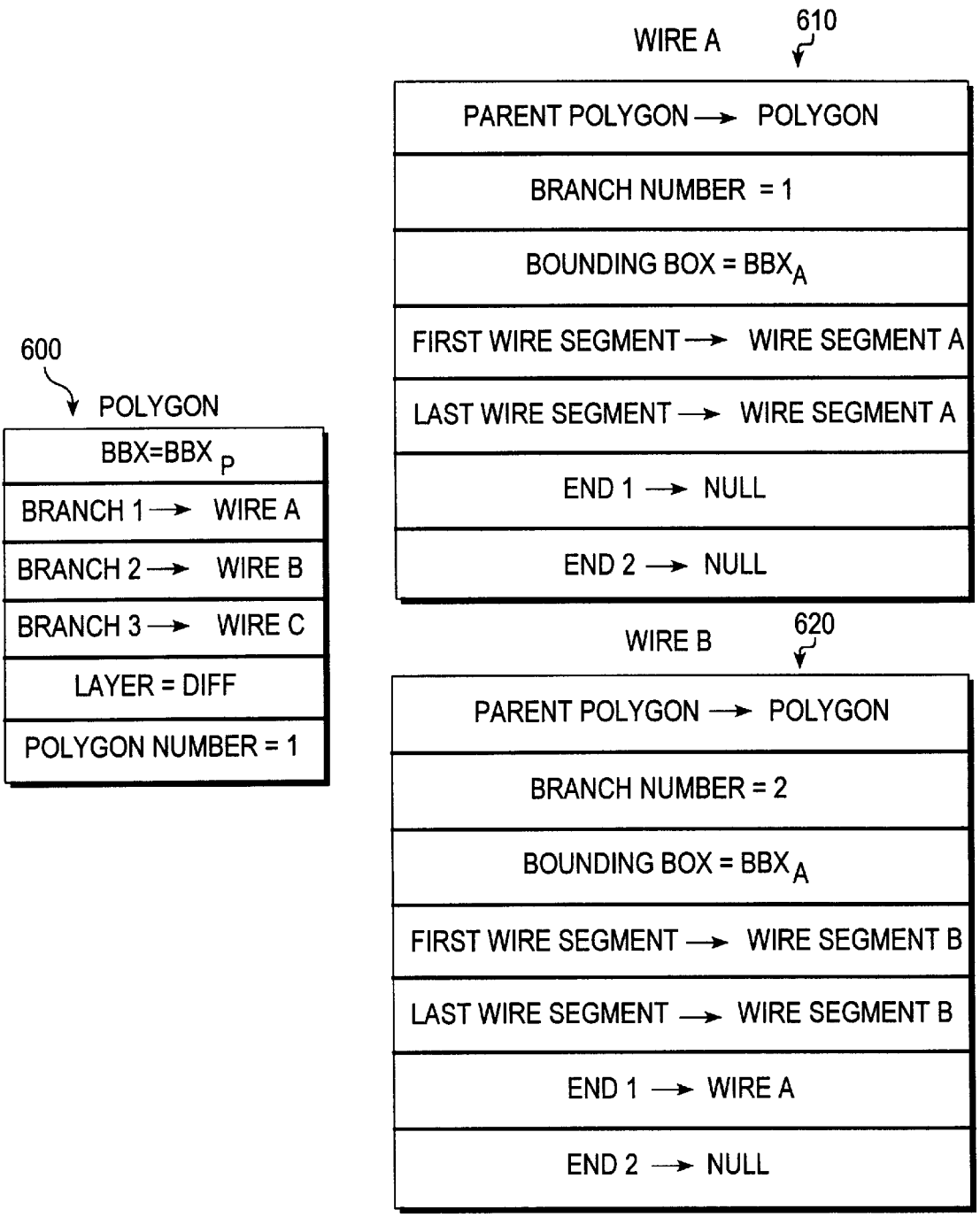
FIGS. 6A–6E illustrate a set of data structures associated with the polygon of FIG. 5 according to an embodiment of the invention.
Figure 6B:
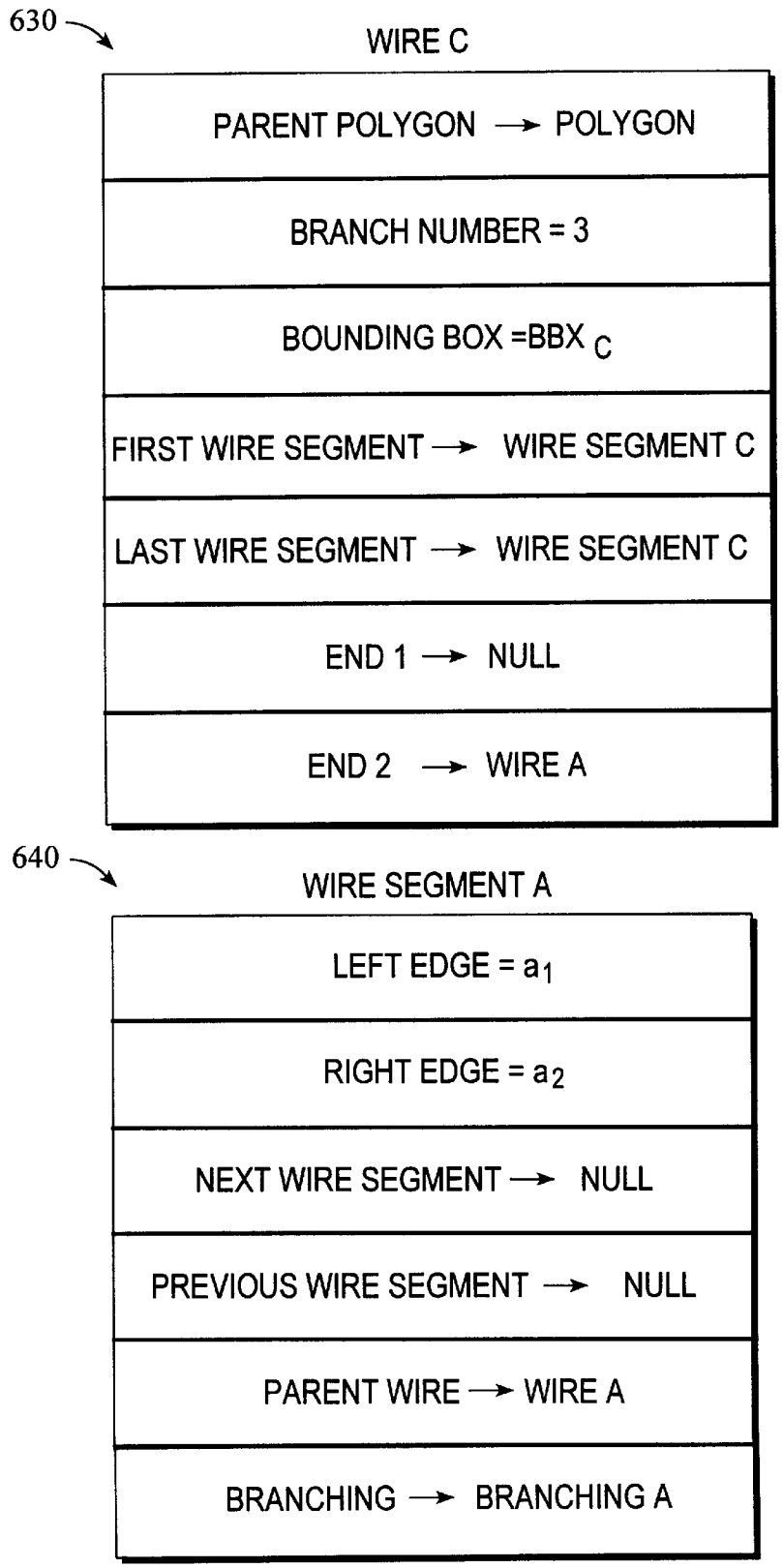
Figure 6C:
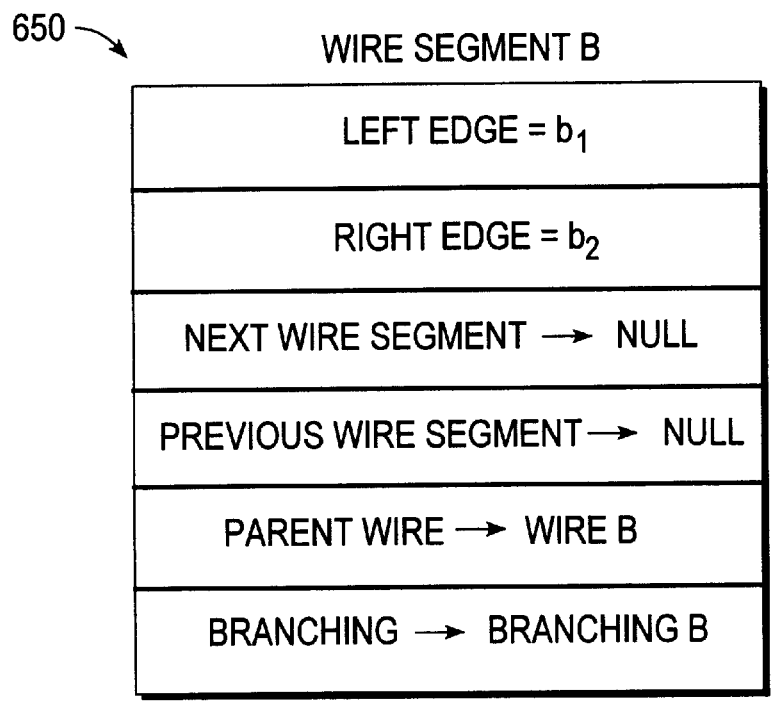
Figure 6C:
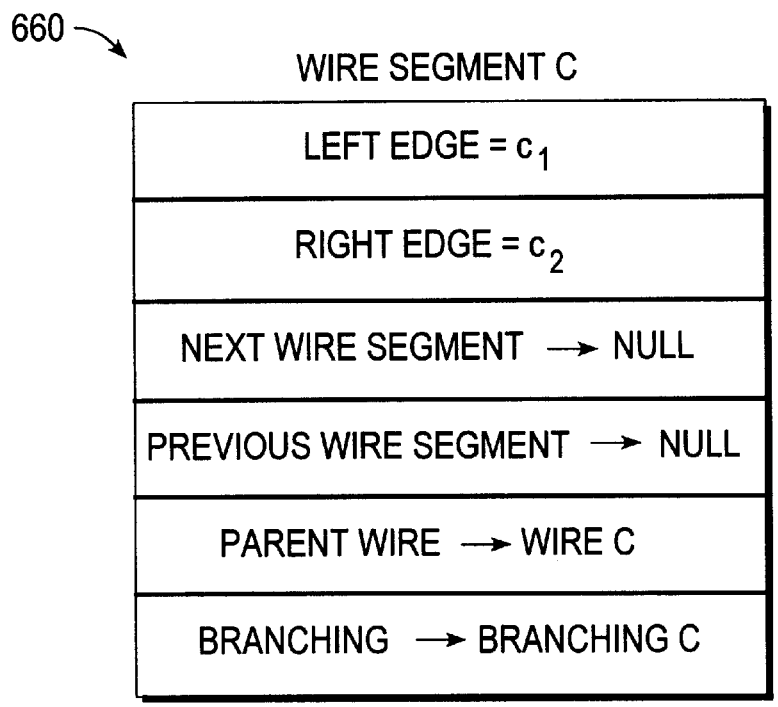
Figure 6D:
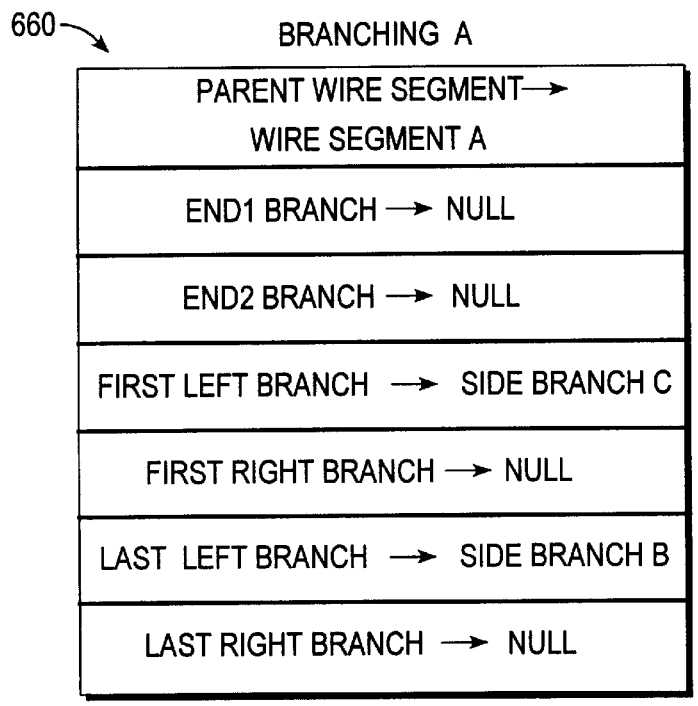
Figure 6D:
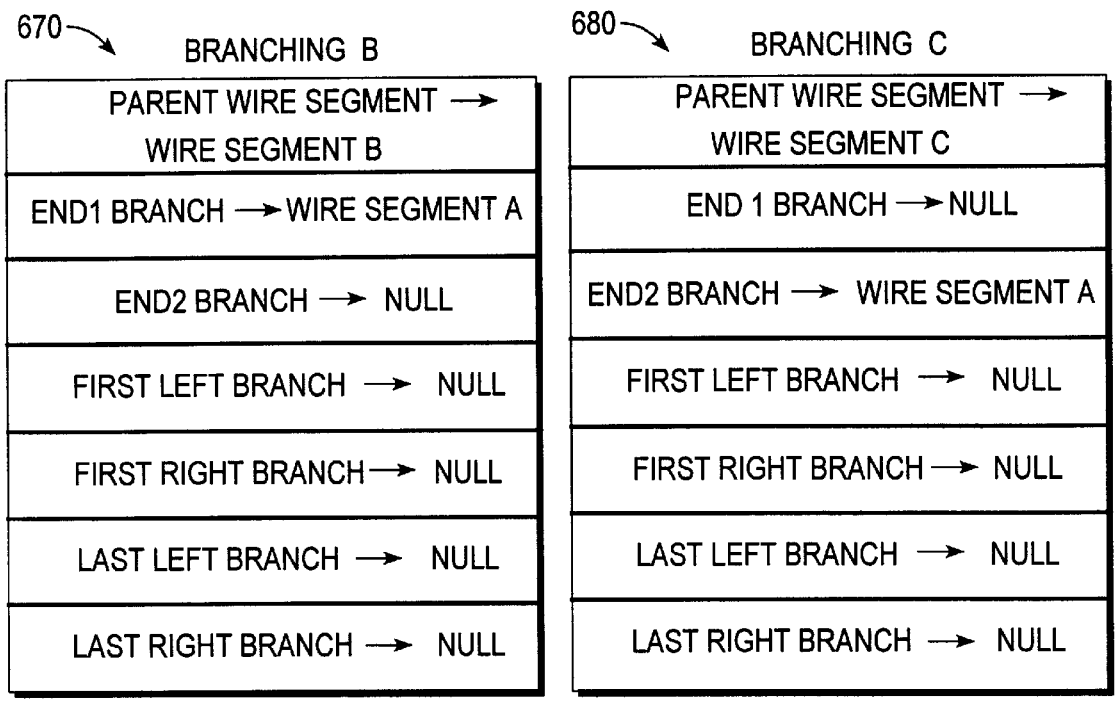
Figure 6E:
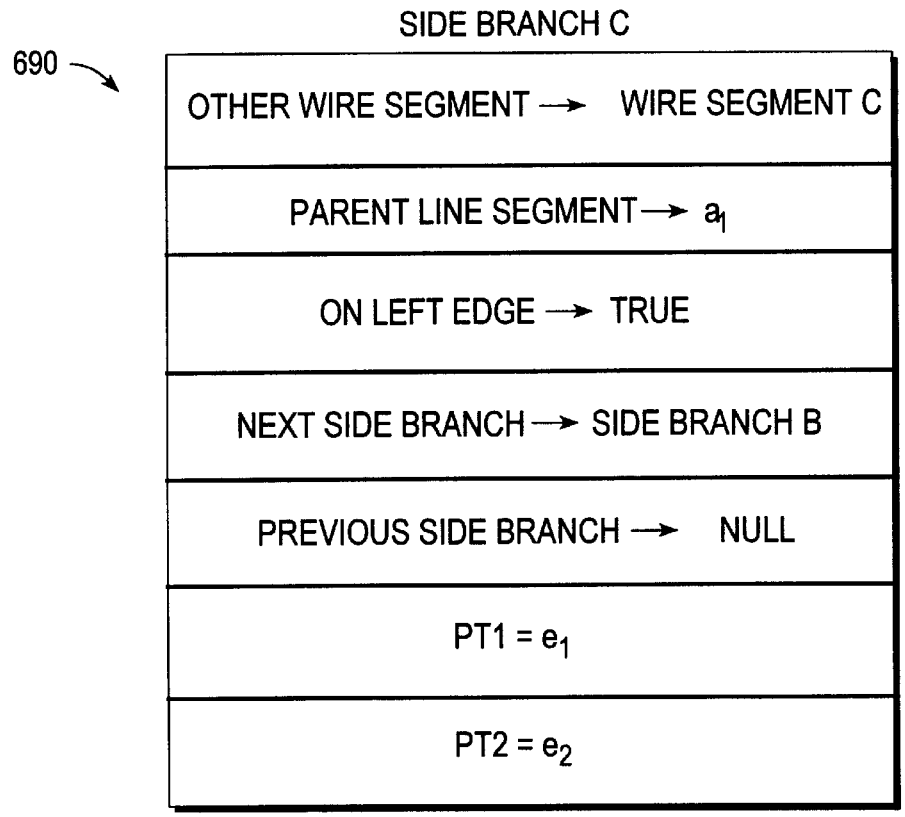
Figure 6E:
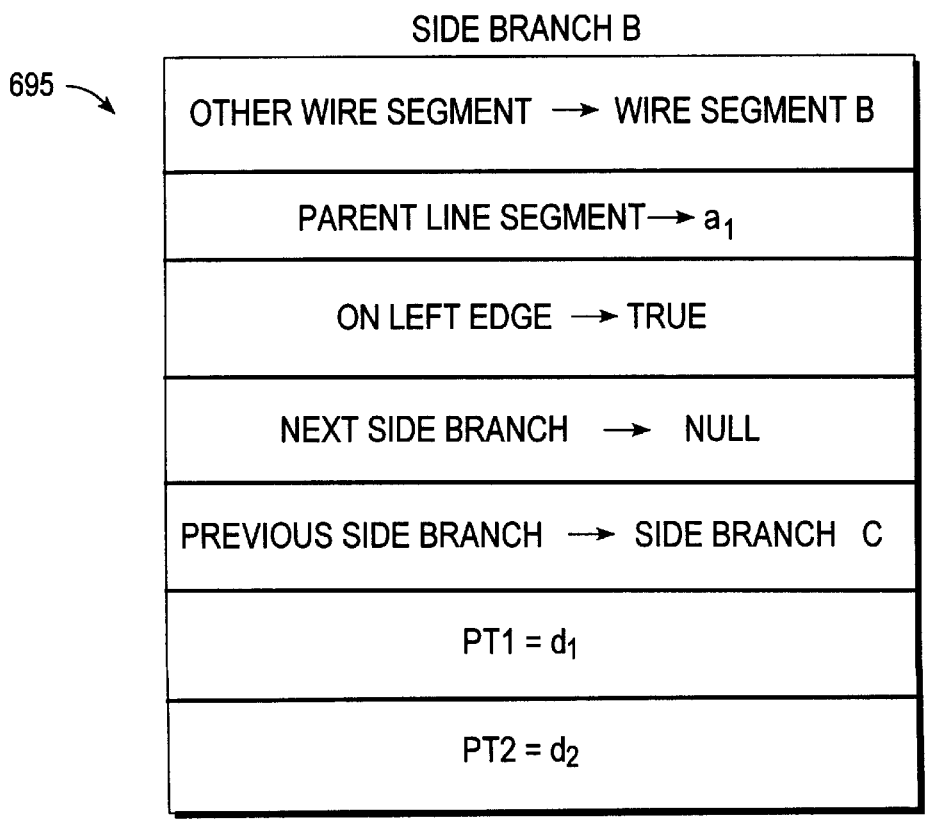

The set of data structures generated to represent polygon 500 according to an embodiment of the invention are illustrated in FIGS. 6A–6E. FIG. 6A illustrates a polygon data structure 600 for polygon 500. Polygon data structure 600 specifies that polygon 500 contains three wires: WIRE A, WIRE B and WIRE C. Polygon data structure 600 also specifies that polygon 500 represents diffusion layer geometry and has a polygon number of 1.

A wire data structure 610 is generated for WIRE A. Similarly, wire data structures 620, 630 are generated for WIRES B and C, respectively. A wire segment data structure 640 is generated for WIRE SEGMENT A. A wire segment data structure 650 is generated for WIRE SEGMENT B. Finally, a wire data structure 660 is generated for WIRE SEGMENT C. Similarly, branching data structures 660, 670 and 680 are generated for each wire segment. In addition, two side branch data structures 690 and 695 are generated for WIRE SEGMENT A, since WIRE B and WIRE C connect with WIRE A along directed edge a, of WIRE A.

Figure 7:
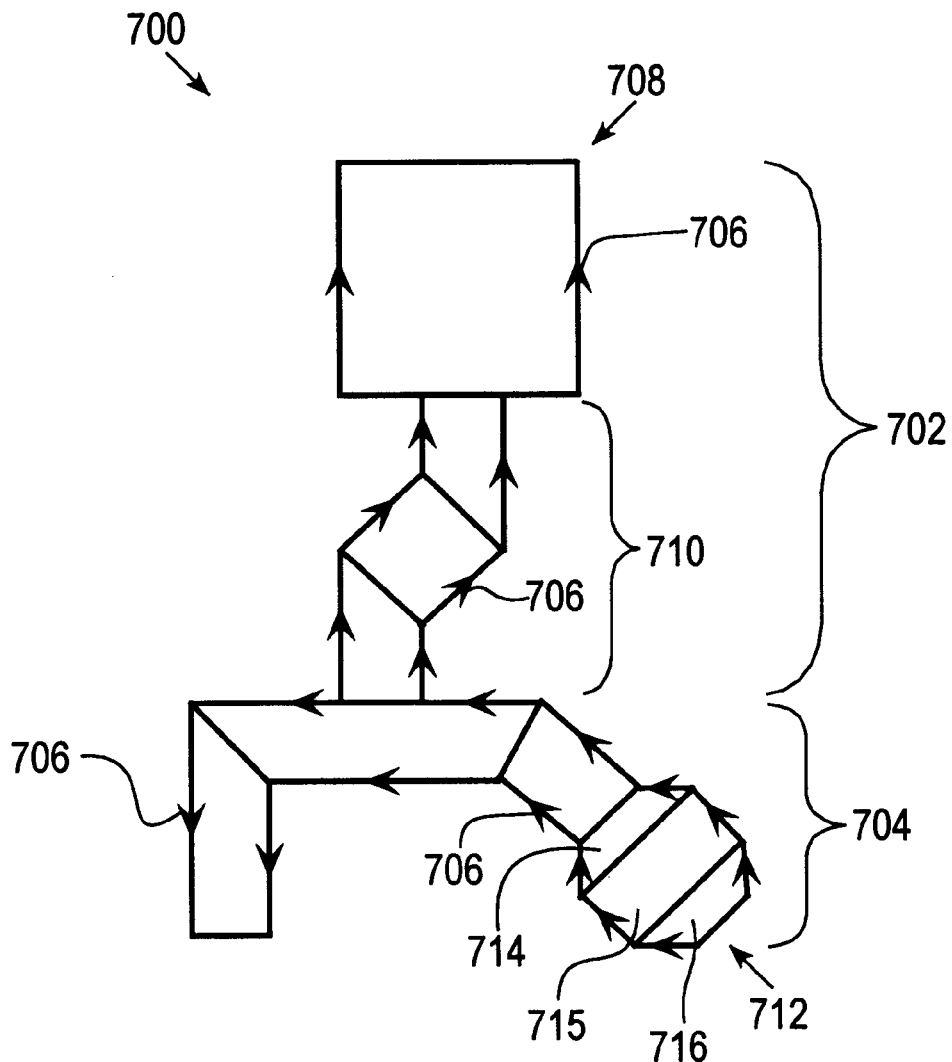
FIG. 7 illustrates a second polygon constructed from wire segments according to an embodiment of the invention.

FIG. 7 illustrates a polygon 700 constructed from two wires 702 and 704 according to an embodiment of the invention. Wires 702 and 704 are constructed from a set of wire segments which are each constructed from a pair of directed line segments. The direction of the directed line segments is indicated by arrows 706.

Polygon 700 includes several different types of IC layout geometry constructed using wire segments, which, according to one embodiment of the invention, represent either polysilicon or metal layer geometry. A contact enclosure 708 is connected to wire 704 via a jogged path 710. Wire 704 includes an octagon-shaped contact enclosure 712 that is constructed from three wire segments 714, 715 and 716. In accordance with an embodiment of the invention and as illustrated by wire segments 714 and 716, directed line segments used to construct a wire segment do not have to be parallel or have endpoints that are coincident with adjacent segments. This aspect of the invention allows a wide variety of IC layout geometry to be constructed using wire segments.

Figure 8:
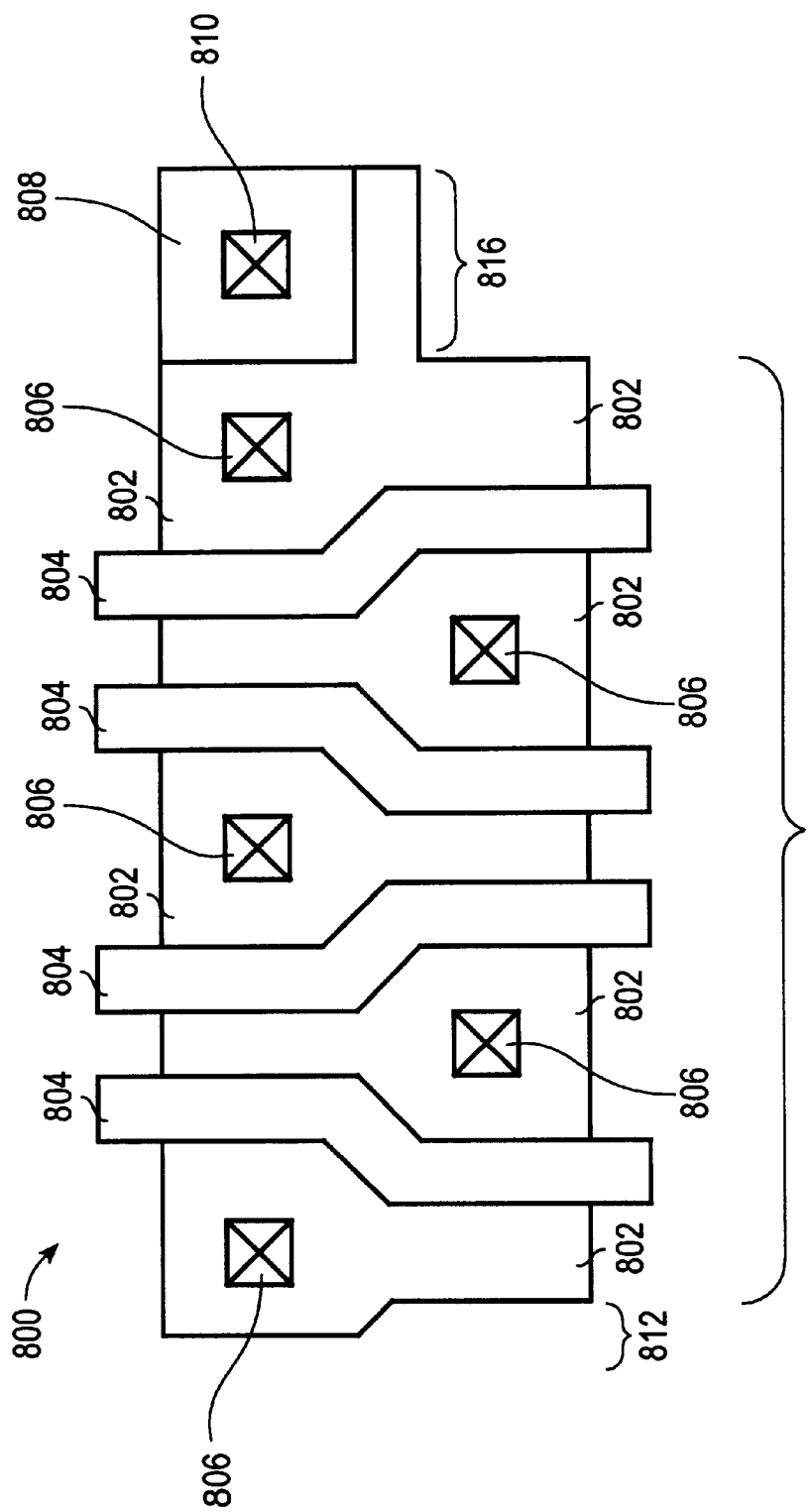
FIG. 8 illustrates a diffusion island constructed from wire segments according to an embodiment of the invention.

FIG. 8 illustrates an IC layout diffusion island 800 constructed from wire segments according to an embodiment of the invention. Diffusion island 800 includes diffusion areas 802 that represent diffusion geometry. Diffusion island 800 also includes polysilicon areas 804 that represent polysilicon geometry. Diffusion island 800 also includes a series of contacts 806. Finally, diffusion island 800 includes a well tie 808 that includes a contact 810.

Diffusion island 800 is represented by three polygons. Despite the irregular shape of diffusion island 800, one polygon contains all of the diffusion areas 802 and is constructed from a wire segment 812, a wire segment 814 and a wire segment 816. Another polygon contains all of the polysilicon areas 804 and is constructed from four wires, one for each polysilicon gate. Another polygon contains all of the contacts 806 as well as contact 810 contained in well tie

808. Contacts 806 may be defined in a single polygon due to their common electrical characteristics or alternatively, may be defined as separate polygons. For example, if a polysilicon gate has more than one contact on a side, the contacts on that side may be represented as one polygon, with one wire per contact region (rectangle/octagon etc.).

3) Use of Data Structures During IC Layout Synthesis

According to an embodiment of the invention, the data structures described above are used during IC layout synthesis to verify that certain characteristics of a layout such as polygon widths, spacing and contact enclosures satisfy predetermined design rules. The concept of canonical direction as described herein is an important aspect of this type of verification because it helps to minimize the number of full checks required in the layout. In the context of IC layout verification, a full check refers to the process of checking all sides of a polygon with respect to another object contained in the IC layout, as differentiated from checking, for example, only the closest side of the polygon to the other object.

a. Determining the Canonical Direction From a Line Segment to a Point

According to an embodiment of the invention, up to three half-plane checks are used to determine the canonical direction from a directed line segment to an arbitrary point. The first half-plane check determines whether the arbitrary point is to the left, right or on top of the directed line segment. The second half-plane check determines whether the arbitrary point is above or below the first end point of the directed line segment. The third half-plane check determines whether the arbitrary point is above or below the second end point of the directed line segment. By evaluating the results of the three half-plane checks, any ambiguity attributable to the location of the arbitrary point with respect to the directed line segment is resolved.

Each half-plane check involves computing the dot product of the arbitrary point with respect to the directed line segment. A line segment representing the boundary of the half-plane is rotated 90° counterclockwise and the arbitrary point is projected into the new line segment. The sign of the dot product then determines whether the arbitrary point is to the left of the half-plane boundary (+1), on the boundary (0), or to the right of the boundary (−1). The three half-plane boundaries are, respectively, the original line segment, a line segment passing through the first end point and rotated 90°, and a line segment passing through the second end point and rotated 90°.

Figure 9A:
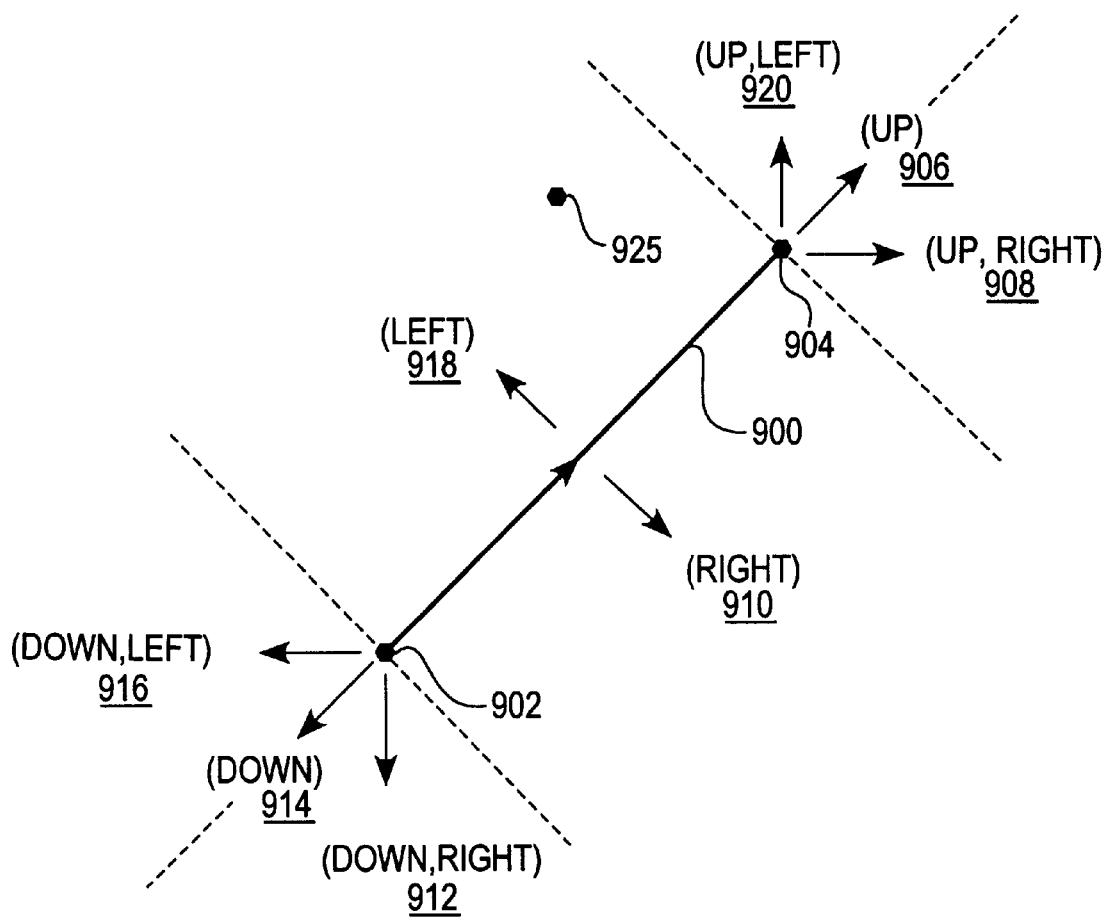
FIG. 9A illustrates a directed line segment and an orientation key according to an embodiment of the invention.

For example, FIG. 9A illustrates a directed line segment 900 that is defined by a first end point 902 and a second end point 904. The areas around directed line segment 900 correspond to orientation key 100 of FIG. 1. Specifically, area 906 defines an area that is up (up) with respect to directed line segment 900. Area 908 defines an area that is up and right (up, right) of directed line segment 900. Area 910 defines an area that is right (right) with respect to directed line segment 900. Area 912 defines an area that is down and right (down, right) of directed line segment 900. Area 914 defines an area that is down (down) with respect to directed line segment 900. Area 916 defines an area that is down and left (down, left) of directed line segment 900. Area 918 defines an area that is to the left of directed line segment 900. Finally, area 920 defines an area that is up and left (up, left) of directed line segment 900.

To determine the canonical direction between an arbitrary point 925 and directed line segment 900, up to three half-plane checks are used. The first half-plane check determines whether point 925 is to the left of, the right of, or on top of directed line segment 900. As illustrated in FIG. 9A, point 925 is to the left of directed line segment 900. This means, that as of the completion of the first half-plane check, point 925 could be located in areas 916, 918 or 920.

The second half-plane check determines whether point 925 is above or below first end point 902 of directed line segment 900. The result of the second half-plane check indicates that point 925 is above first end point 902, meaning that point 925 cannot be located in area 916 and must be located in either area 918 or area 920. The third half-plane check determined whether point 925 is above or below second end point 904. As illustrated, the second half-plane check indicates that point 925 is below second end point 904, meaning that point 925 must be located in area 918, or to the left of directed line segment 900.

b. Determining the Canonical Direction From a Wire Segment to a Point

To perform spacing checks during IC layout verification, distances between polygons must be determined and then compared to the minimum separation required by the design rules applied. Typically, a spacing check is performed between a polygon and a selected point on another polygon.

According to an embodiment of the invention, a method is provided for determining the canonical direction from a wire segment to a point so that at most, only two faces of a polygon need to be checked against the point. Up to four checks of the canonical direction from segment faces to the arbitrary point are performed to determine the canonical direction from a wire segment to a point and resolve any ambiguity attributable to whether the point is located inside or outside the wire segment.

Figure 9B:
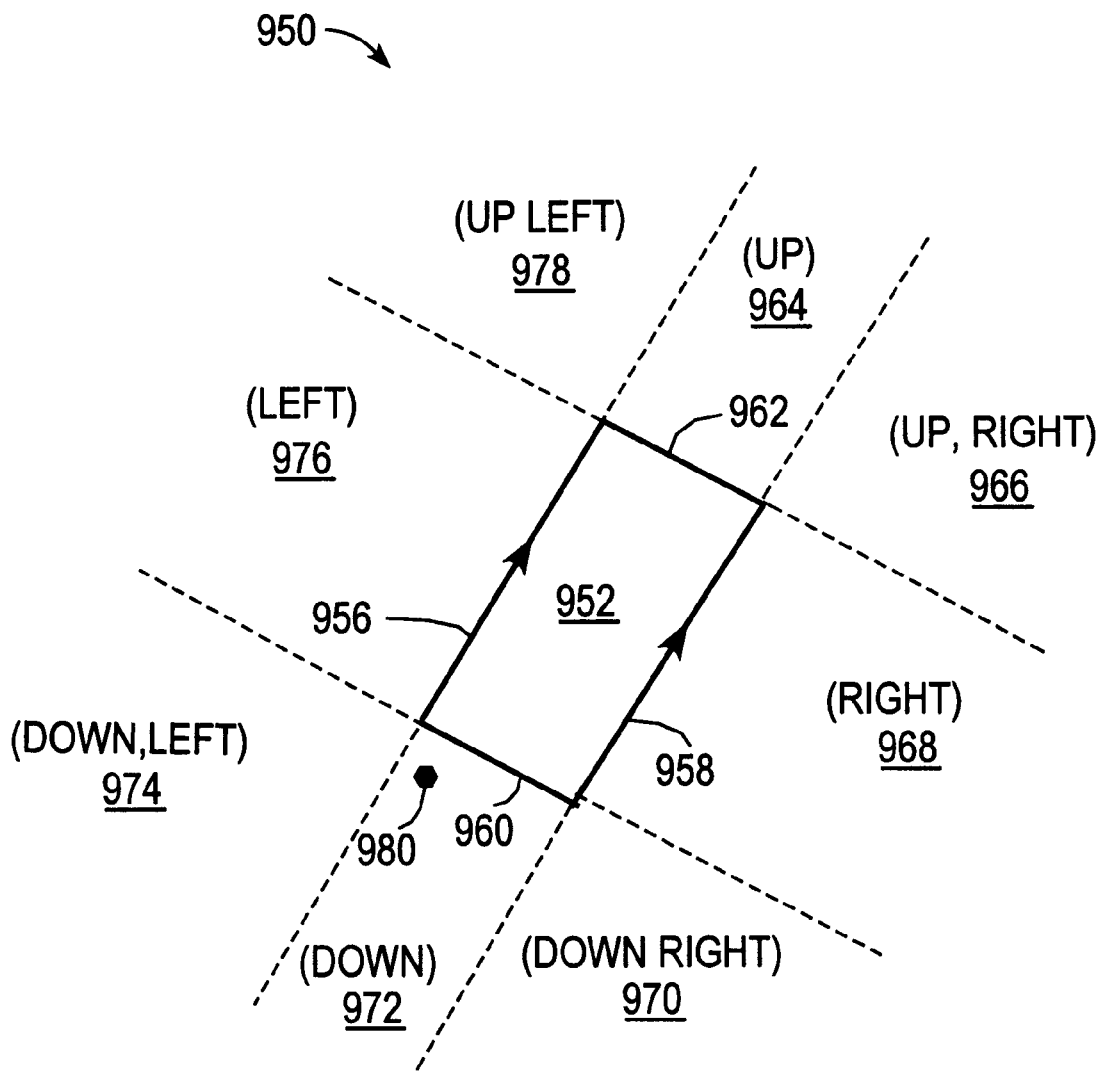
FIG. 9B illustrates a wire segment and an orientation key according to an embodiment of the invention.

FIG. 9B illustrates a wire segment 952 that is defined by a left face 956, a right face 958, a first end face 960 and a second end face 962. The areas around wire segment 952 correspond to orientation key 100 of FIG. 1. Specifically, area 964 defines an area that is up (up) with respect to wire segment 952. Area 966 defines an area that is up and right (up, right) with respect to wire segment 952. Area 968 defines an area that is right (right) with respect to wire segment 902. Area 920 defines an area that is down and right (down, right) with respect to wire segment 952. Area 972 defines an area that is down (down) with respect to wire segment 952. Area 974 defines an area that is down and left (down, left) with respect to wire segment 952. Finally, area 976 defines an area that left (left) with respect to wire segment 952. Area 978 defines an area that is up and left (up, left) with respect to wire segment 952.

For example, suppose the canonical direction from wire segment 952 to a point 980 is to be determined. A first canonical direction check of point 980 with respect to left face 956 is performed to determine whether point 980 is to the left, right or on top of left face 956. In this situation, the first canonical direction check indicates that point 980 is to the right of left face 956. Thus, based upon the results of the first canonical direction check, point 980 must be located in area 964, 966, 968, 970, 972 or within wire segment 952.

A second canonical direction check of point 980 with respect to right face 958 is performed to determine whether point 980 is to the left, right or on top of right face 958. In this situation, the second canonical direction check indicates that point 980 is to the left of right face 958. Thus, based upon the results of both first and second canonical direction checks performed, point 980 must be located in areas 964, 972 or within wire segment 952.

A third canonical direction check of point 980 with respect to first end face 960 is performed to determine whether point 980 is to the left, right or on top of first end face 960. In this situation, the third canonical direction check indicates that point 980 is to the left of first end face 960. Therefore, based upon the results of the three canonical direction checks, point 980 must be located in area 972, or (down) with respect to wire segment 952.

For the particular scenario just described, only three canonical direction checks were required to unambiguously determine the canonical direction from a wire segment to a point. However, in some situations a fourth canonical direction check is required to definitively determine the canonical direction between a wire segment and a point. For example, where the third canonical direction check of point 980 with respect to first end face 960 indicates that point 980 is to the right of first end face 960, then a fourth canonical direction check of point 980 with respect to second end face 962 is required to determine whether point 970 is located in area 964 or located within, or on top of, wire segment 952.

The canonical direction from the wire segment faces to arbitrary point 980 is used to ensure that areas 964, 966, 968, 970, 972, 974, 976 and 978 do not narrow as the distance from arbitrary point 980 to wire segment 952 increases. This can occur whenever the angle between two adjacent faces is greater than 90°.

c. Spacing Checks

Figure 10:
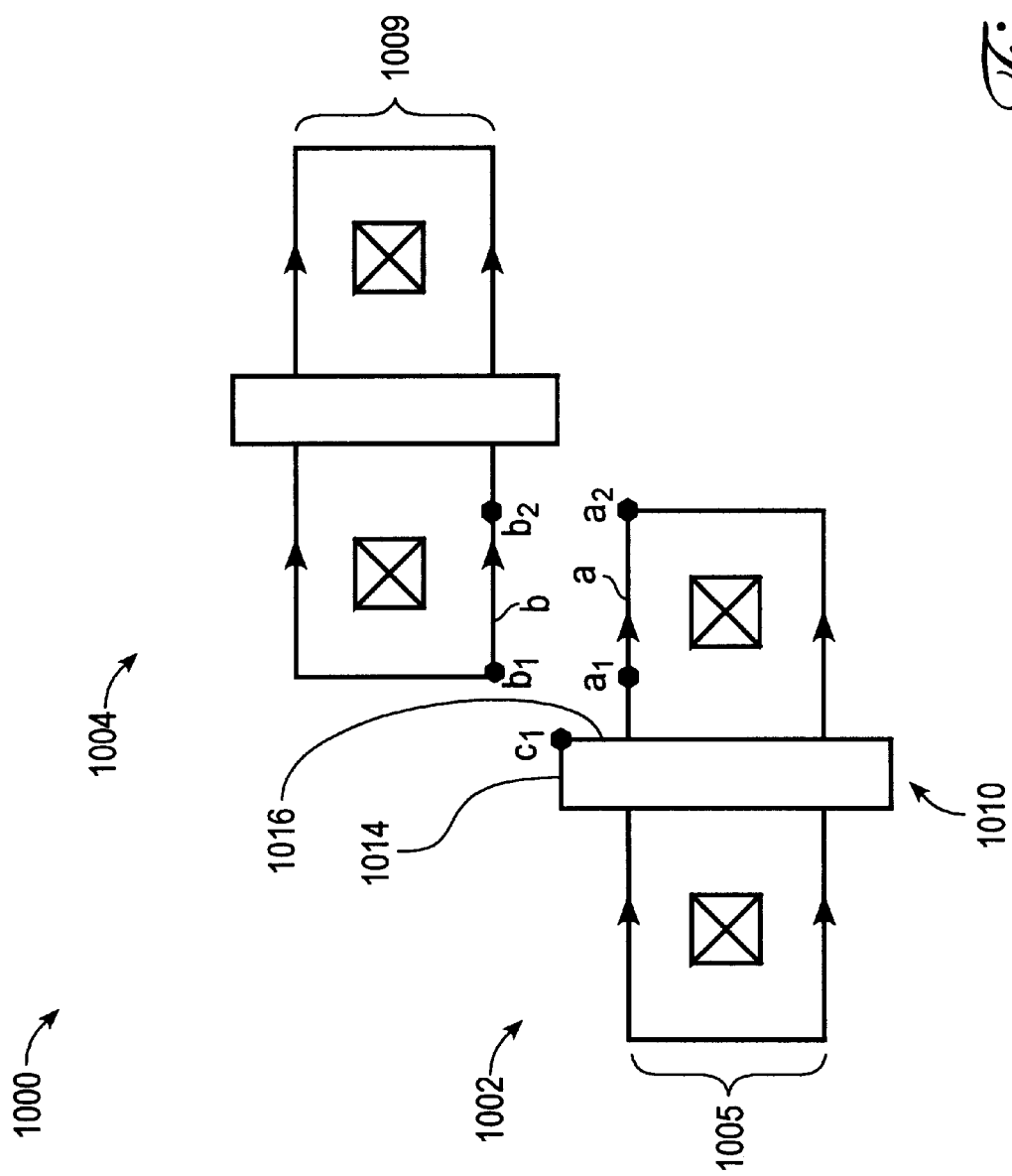
FIG. 10 illustrates a portion of an IC layout constructed using wire segments according to an embodiment of the invention.

According to an embodiment of the invention, an approach for performing spacing checks between polygons constructed using wire segments and canonical direction is provided. FIG. 10 illustrates an IC layout 1000 that contains a diffusion island 1002 and a diffusion island 1004. Diffusion island 1002 includes a polygon 1005 that represents diffusion geometry and is constructed from a single wire segment. Similarly, diffusion island 1004 includes a polygon 1009 that represents diffusion geometry and is constructed from a single wire segment.

According to an embodiment of the invention, performing a spacing check between parallel, overlapping edges of wire segments is accomplished by comparing the orthogonal distance between the wires to the minimum spacing required by the applicable design rules. For example, performing a spacing check between polygon 1005 and polygon 1009 involves computing an orthogonal distance between points $a_1$ and $a_2$ on directed line segment a, and points $b_1$ and $b_2$ on line segment b, and then comparing the computed distance to the minimum spacing specified by the design rules. If the computed distance does not satisfy the minimum spacing specified by the design rules, then one of the polygons 1005 or 1009 must be moved. For example, if the spacing between polygon 1005 and polygon 1009 does not satisfy the minimum spacing specified by the design rules, then polygon 1005 may be moved in the down direction to increase the spacing between polygon 1005 and polygon 1009. Alternatively, polygon 1009 may be moved in the up direction.

For computing the spacing between non-overlapping wires, the closest corners between the two wires are used and instead of an orthogonal distance, a non-orthogonal or manhattan distance is used. The term Manhattan distance refers to a distance where each unit is one unit over in the X direction and one unit over in the Y direction. The resulting direction vector is then one of (up, left), (up, right), (down, right) or (down, left). If the spacing does not satisfy the minimum spacing specified by the design rules, then one of the polygons is moved in a direction that is opposite to the two opposing faces of one of the corners.

For example, suppose in FIG. 10 a diffusion to polysilicon spacing check is performed between point $b_1$ on polygon 1009 and point $c_1$ on a polygon 1010. If the distance between points $b_1$ and $c_1$ does not satisfy the minimum spacing specified by the design rules then polygon 1010 is moved in the (down, left) direction since one of the closest faces 1014 of polygon 1010 is directed up, and the other of the closest faces 1016 is directed right. Similarly, polygon 1009 could be moved in the (up, right direction).

Once a spacing violation has been identified and the direction that one of the polygons must be moved to satisfy the design rules has been determined, the distance that the polygon must be moved to satisfy the minimum spacing requirements must be determined. According to an embodiment of the invention, a novel approach is provided for determining the distance to relocate layout geometry to satisfy a spacing requirement. Generally, the approach involves constructing an "exclusion zone" around layout geometry to define the minimum separation that must be maintained between that layout geometry and other layout geometry to satisfy the minimum spacing required by the design rules. This approach is not dependent upon any particular data structure architecture. If a point that is part of the other geometry is within the exclusion zone, then a spacing violation exists.

Figure 11:
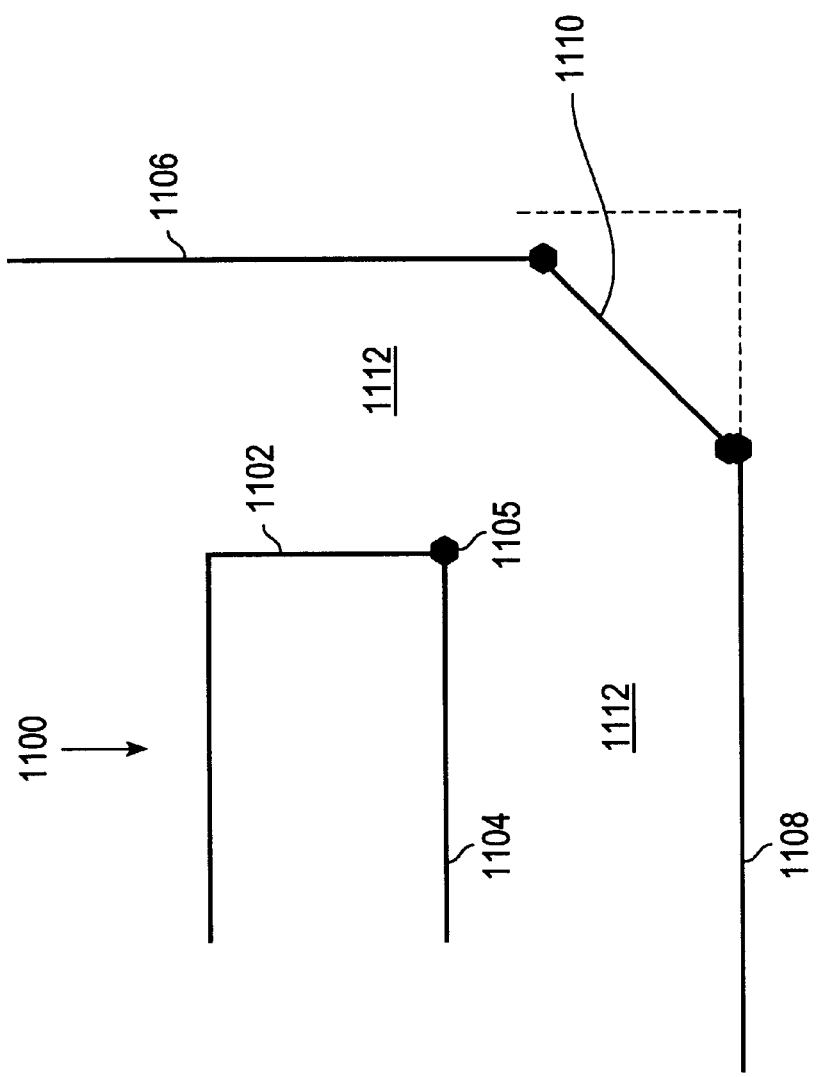
FIG. 11 illustrates the use of an exclusion zone to determine polygon spacing according to an embodiment of the invention.

As illustrated in FIG. 11, a wire segment 1100 is at least partially constructed from two directed line segments 1102 and 1104 that meet at a point 1105. To construct the exclusion zone, two lines 1106 and 1108 are constructed along the direction vectors of line segments 1102 and 1104 at a separation from directed line segments 1102, 1104 to meet the design rule. Lines 1106 and 1108 are formed by moving outward from point 1105 in a direction perpendicular to the direction of directed line segments 1102 and 1104. If directed line segments 1102 and 1104 are perpendicular to each other, then a third line 1110 is constructed that connects lines 1106 and 1108. Lines 1106, 1108 and 1110 form an exclusion zone 1112 around wire segment 1100. If directed line segments 1102 and 1104 are orthogonal, the placement of lines 1106 and 1108 with respect to directed line segments 1102 and 1104 is based upon the cartesian width, spacing or enclosure value. The placement of third line 1110 is based upon the Manhattan width, spacing or enclosures as specified by the design rules. As the Manhattan width, spacing or enclosures rule increases relative to the Cartesian rule, line 1110 moves outward from wire segment 1100, while lines 1106 and 1108 remain in place. In the limit, line 1110 may move out to the intersections of lines 106 and 1108.

On the other hand, if directed line segments 1102 and 1104 are non-orthogonal, the placement of lines 1106 and 1108 with respect to directed line segments 1102 and 1104 is based upon the Cartesian width, spacing or enclosure value divided by the square root of two and rounded up to the next integer value to provide the manhattan distance necessary to obtain the required Cartesian distance.

Figure 12:
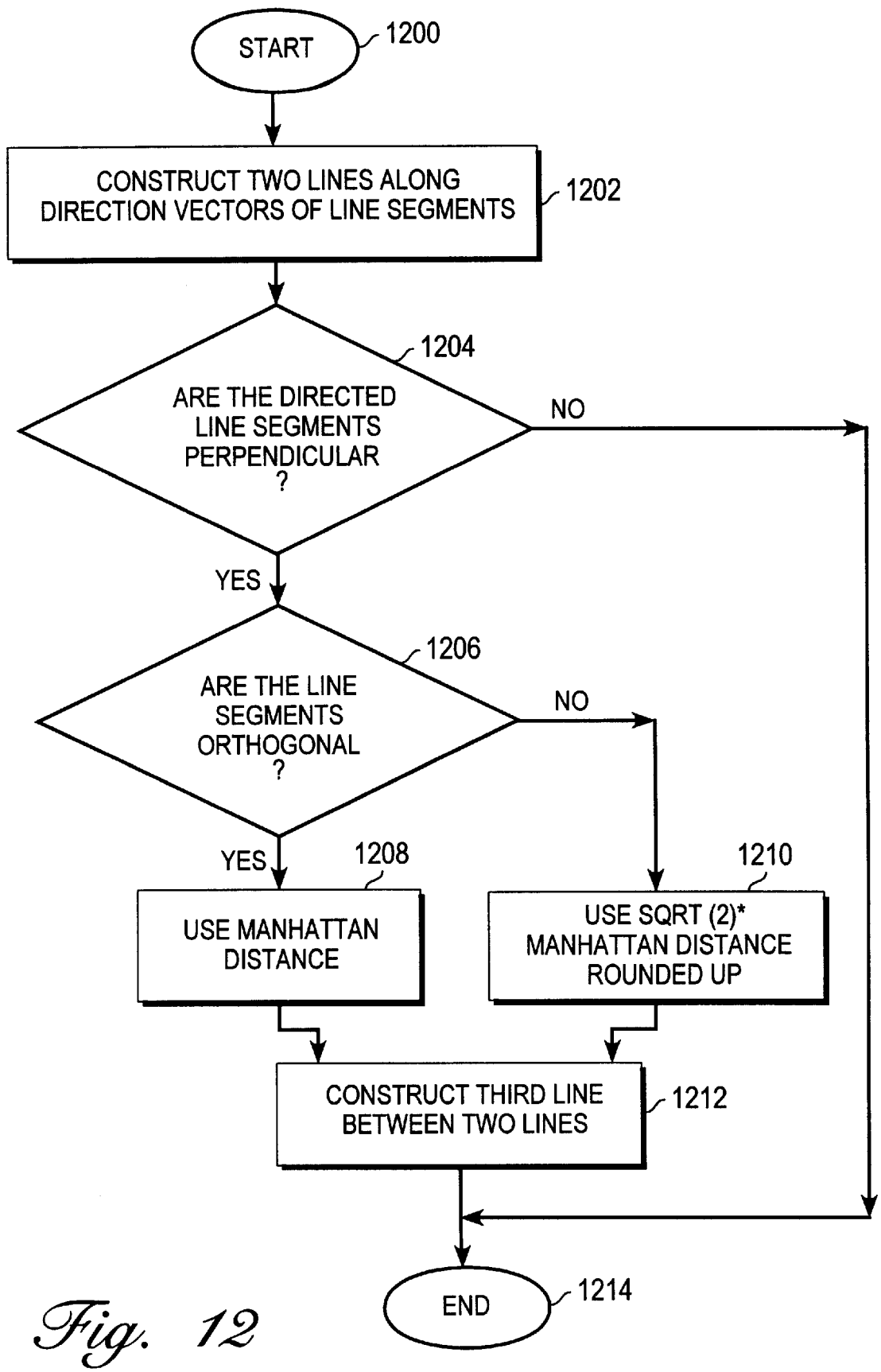
FIG. 12 is a flow chart that illustrates a method for performing a spacing check between polygons according to an embodiment of the invention.

The approach for relocating a wire segment to satisfy a spacing requirement according to an embodiment of the invention is now described with reference to the flow chart of FIG. 12. After starting in step 1200, in step 1202 two lines 1106 and 1108 are constructed along the direction vectors of the two line segments that make up the wire segment. In step 1204, a determination is made as to whether the directed line segments 1102, 1104 are perpendicular. If so, then in step 1206 a determination is made as to whether the directed line segments 1102, 1104 are orthogonal. If the directed line segments 1102, 1104 are both perpendicular and orthogonal, then in step 1208, the manhattan distance is used to position a third line 1110 with respect to two constructed lines.

If, on the other hand, in step 1204 a determination is made that the directed line segments 1102, 1104 are not perpendicular, then the exclusion zone comprises the directed line segments 1106 and 1108 and the process is complete in step 1214. However, if in step 1206, a determination is made that the directed line segments 1102, 1104 are not orthogonal, then in step 1210, the location of the third line 1110 with respect to the first two constructed lines is based upon the minimum Cartesian distance (product of the square root of 2 and the manhattan distance, rounded up) specified by the design rules.

Then, in step 1212, the third line 1110 is constructed and positioned between directed line segments 1102 and 1104. The process is complete in step 1214. This approach may also be used to check and correct polygon widths and contact enclosures.

d. Generating Polygon Output

According to an embodiment of the invention, the capability to generate polygon output based upon the data structure hierarchy described herein is provided. This approach produces fewer polygons than the alternative approach of generating one polygon for each wire segment. Generating fewer polygons reduces the time required to run analysis programs such as design rule checks, circuit extraction and mask fabrication. In the context of computer aided design packages, fewer polygons can also make viewing a layout easier because there are fewer polygons on the screen. Generally, the approach involves evaluating the wire segment data structures for each wire to identify colinear sets of points that are then combined to reduce the number of polygons. According to one embodiment of the invention, the left faces of contiguous wire segments are evaluated and then the right faces of the same contiguous wire segments are evaluated.

Figure 13A:
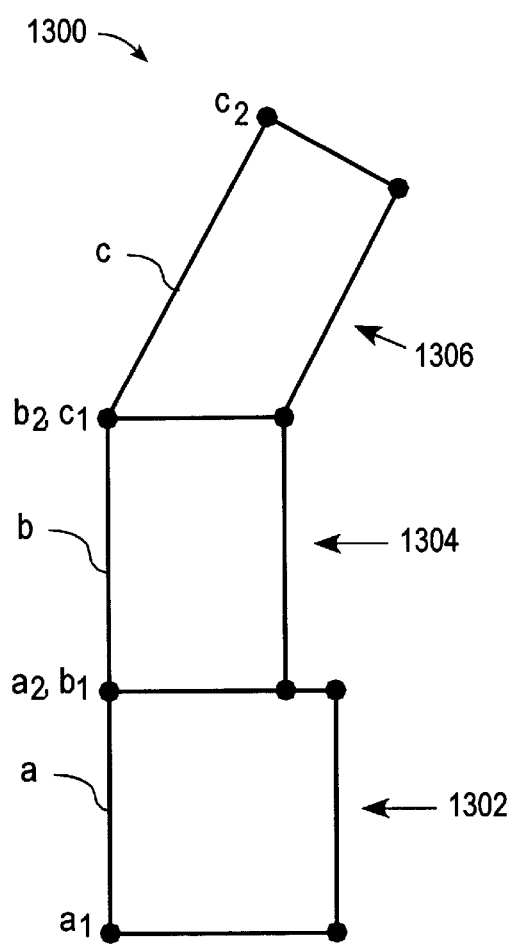
FIG. 13A illustrates a wire constructed using wire segments according to an embodiment of the invention.
Figure 13B:
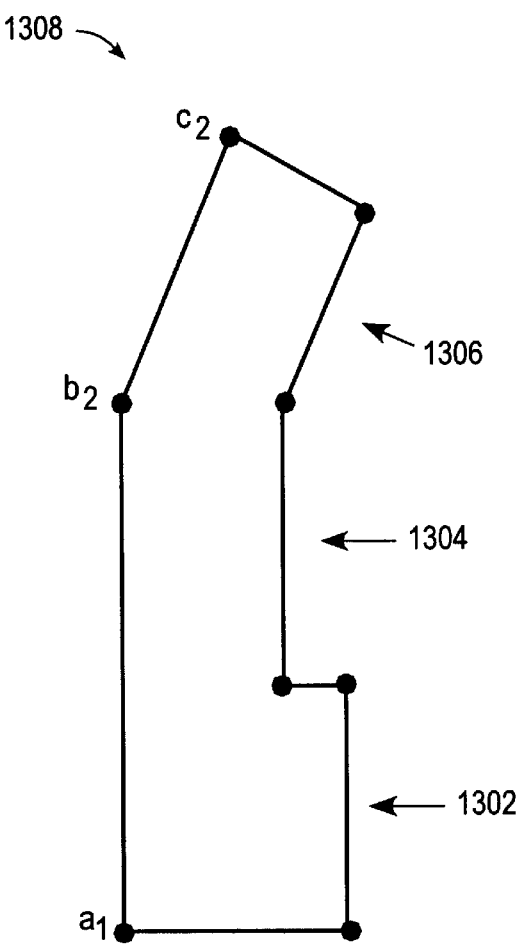
FIG. 13B illustrates a polygon representation of the wire of FIG. 13A according to an embodiment of the invention.

For example, FIG. 13A illustrates a wire 1300 that is constructed from three contiguous wire segments 1302, 1304 and 1306 according to an embodiment of the invention. The left face of wire segment 1302 is defined by a directed line segment a, which in turn is defined by end points $a_1$ and $a_2$. The left face of wire segment 1304 is defined by a directed line segment b, which in turn is defined by end points $b_1$ and $b_2$. The left face of wire segment 1306 is defined by a directed line segment c, which in turn is defined by end points $c_1$ and $c_2$. To generate a polygon representation of wire 1300 according to an embodiment of the invention, colinear sets of points along the left and right sides of wire segments 1302, 1304 and 1306 are combined. Since directed line segment a is colinear with directed line segment b, points $a_2$ and $b_1$ can be eliminated, effectively generating a single left face along wire segments 1302 and 1304. Similarly, since points $b_2$ and $c_1$ are coincident, they can be replaced with a single point. FIG. 13B illustrates a polygon representation 1308 of wire 1300 of FIG. 13A after colinear sets of points have been combined according to an embodiment of the invention.

Some polygon manipulation processes define a maximum number of polygon points per polygon. In this situation, the number of segments that may be traced according to this approach is limited to the maximum number of allowable polygons divided by four. If the number of wire segments exceeds this number, for a given wire, then additional polygons are used to represent that wire.

Hardware Overview

FIG. 14 is a block diagram that illustrates a computer system 1400 upon which an embodiment of the invention may be implemented. Computer system 1400 includes a bus 1402 or other communication mechanism for communicating information, and a processor 1404 coupled with bus 1402 for processing information. Computer system 1400 also includes a main memory 1406, such as a random access memory (RAM) or other dynamic storage device, coupled to bus 1402 for storing information and instructions to be executed by processor 1404. Main memory 1406 also may be used for storing temporary variables or other intermediate information during execution of instructions to be executed by processor 1404. Computer system 1400 further includes a read only memory (ROM) 1408 or other static storage device coupled to bus 1402 for storing static information and instructions for processor 1404. A storage device 1410, such as a magnetic disk or optical disk, is provided and coupled to bus 1402 for storing information and instructions.

Computer system 1400 may be coupled via bus 1402 to a display 1412, such as a cathode ray tube (CRT), for displaying information to a computer user. An input device 1414, including alphanumeric and other keys, is coupled to bus 1402 for communicating information and command selections to processor 1404. Another type of user input device is cursor control 1416, such as a mouse, a trackball, or cursor direction keys for communicating direction information and command selections to processor 1404 and for controlling cursor movement on display 1412. This input device typically has two degrees of freedom in two axes, a first axis (e.g., x) and a second axis (e.g., y), that allows the device to specify positions in a plane.

The invention is related to the use of computer system 1400 for representing polygons in an IC layout. According to one embodiment of the invention, the representation of polygons in an IC layout is provided by computer system 1400 in response to processor 1404 executing sequences of instructions contained in main memory 1406. Such instructions may be read into main memory 1406 from another computer-readable medium, such as storage device 1410. However, the computer-readable medium is not limited to devices such as storage device 1410. For example, the computer-readable medium may include a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Execution of the sequences of instructions contained in main memory 1406 causes processor 1404 to perform the process steps previously described. In alternative embodiments, hard-wired circuitry may be used in place of or in combination with software instructions to implement the invention. Thus, embodiments of the invention are not limited to any specific combination of hardware circuitry and software.

Computer system 1400 also includes a communication interface 1418 coupled to bus 1402. Communication interface 1418 provides a two-way data communication coupling to a network link 1420 that is connected to a local network 1422. For example, communication interface 1418 may be an integrated services digital network (ISDN) card or a modem to provide a data communication connection to a corresponding type of telephone line. As another example, communication interface 1418 may be a local area network (LAN) card to provide a data communication connection to a compatible LAN. Wireless links may also be implemented. In any such implementation, communication interface 1418 sends and receives electrical, electromagnetic or optical signals that carry digital data streams representing various types of information.

Network link 1420 typically provides data communication through one or more networks to other data devices. For example, network link 1420 may provide a connection through local network 1422 to a host computer 1424 or to data equipment operated by an Internet Service Provider (ISP) 1426. ISP 1426 in turn provides data communication services through the world wide packet data communication network now commonly referred to as the "Internet" 1428. Local network 1422 and Internet 1428 both use electrical, electromagnetic or optical signals that carry digital data streams. The signals through the various networks and the signals on network link 1420 and through communication interface 1418, which carry the digital data to and from computer system 1400, are exemplary forms of carrier waves transporting the information.

Computer system 1400 can send messages and receive data, including program code, through the network(s), network link 1420 and communication interface 1418. In the Internet example, a server 1430 might transmit a requested code for an application program through Internet 1428, ISP 1426, local network 1422 and communication interface 1418. In accordance with the invention, one such downloaded application provides for the representation of polygons in an IC layout as described herein.

The received code may be executed by processor 1404 as it is received, and/or stored in storage device 1410, or other non-volatile storage for later execution. In this manner, computer system 1400 may obtain application code in the form of a carrier wave.

Although embodiments of the invention have been described in the context of IC layouts including transistors for illustration purposes, the invention is applicable to IC layouts including any type of integrated circuit components or devices, such as resistors, capacitors, logic gates, or any other type of IC devices.

The invention provides several advantages over prior approaches for representing polygons in an IC layout. First, even the most complex geometry can be represented using wire segments, including octagon-shaped contact enclosures and irregular-shaped diffusion islands. Also, representing polygons using wire segments facilitates geometrical analysis such as spacing and enclosure checking. Wire segments are convenient for geometric analysis because most of the exposed polygon edges are known and width, spacing, and enclosure checks are valid only when applied to exposed polygon edges. Many of the horizontal edges in a database of trapezoids are actually internal to the polygons, and the analysis software must expend significant effort to find the external edges. Wire segments can also represent many common layout shapes directly, allowing more-complex rules (such as the exclusion zone) to be implemented easily. For example, a polysilicon gate might have a requirement that its width be larger when the gate polygon is traversing at an angle. Because the gate polygon is composed directly of wire segments, it is easy to enforce this rule on a segment-by-segment basis by checking the line segment directions and ensuring their separation is larger when their angles are non-orthogonal. The wire segment approach also facilitates relatively easy electrical analysis such as resistance checking because the use of wire segments allows the resistance of a wire to be calculated quickly. The wire segment approach is also well suited for being implemented in computer software because wire segments are easily represented in data structures. The advantage of wire segments is that they are much closer in form to commonly-used layout structures, so many fewer of them are needed to represent these structures, and it is much less likely that the shape of an object is not obvious after inspecting only one or two data structures. With trapezoids and rectangles, a minor change to the polygon shape can cause the trapezoid data structures to be modified all the way on the other side of the polygon, making it difficult to work with a polygon as a unit.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A computer system for generating a data representation of an integrated circuit (IC) layout, the computer system comprising:

a) a memory; and b) one or more processors coupled to the memory, wherein the memory contains a set of instructions which, when executed by the one or more processors, cause the one or more processors to perform the steps of i) generating polygon data associated with a polygon that represents a set of IC devices to be represented by the IC layout, wherein the polygon is represented by one or more wires, each of the one or more wires is represented by one or more wire segments and each of the one or more wire segments is represented by two directed line segments, ii) generating wire data that both represents the one or more wires and contains at least one reference to the polygon data, iii) generating wire segment data that both represents the one or more wire segments and contains at least one reference to the wire data, and iv) generating directed line segment data that represents the two directed line segments for each wire segment and indicates a direction of each directed line segment.

2. The computer system of claim 1, wherein the set of instructions further includes instructions which, when executed by the one or more processors cause the one or more processors to perform the steps of:

v) generating at least one reference in the polygon data that references the wire data, and vi) generating at least one reference in the wire data that references the wire segment data.

3. The computer system of claim 2, wherein the step of v) generating at least one reference in the polygon data that references the wire data includes the step of for each wire represented in the wire segment data, generating a reference in the polygon data that references data in the wire data that represents that wire, and the step of vi) generating at least one reference in the wire data that references the wire segment data includes for each of the one or more wires generating a reference in the wire data that references both the first and last wire segments contained in the wire.

4. The computer system of claim 1, wherein the directed line segment data indicates for each directed line segment a change in first coordinates for a change in second coordinates, and the set of instructions further includes instructions which, when executed by the one or more processors, cause the one or more processors to perform the step of generating directed line segment data that indicates for each directed line segment a change in first coordinates for a change in second coordinates.

5. The computer system of claim 1, wherein the set of instructions further includes instructions which, when executed by the one or more processors, cause the one or more processors to perform the step of generating branch data that specifies wire segments associated with connected wires.

6. A computer-readable medium carrying sequences of instructions for generating a data representation of an integrated circuit layout, the sequences of instructions including instructions which, when executed by one or more processors, cause the one or more processors to perform the steps of:

a) generating polygon data associated with a polygon that represents a set of IC devices to be represented by the IC layout, wherein the polygon is represented by one or more wires, each of the one or more wires is represented by one or more wire segments and each of the one or more wire segments is represented by two directed line segments, b) generating wire data that both represents the one or more wires and contains at least one reference to the polygon data, c) generating wire segment data that both represents the one or more wire segments and contains at least one reference to the wire data, and d) generating directed line segment data that represents the two directed line segments for each wire segment and indicates a direction of each directed line segment.

7. The computer-readable medium of claim 6, wherein the sequences of instructions include instructions for e) generating at least one reference in the polygon data that references the wire data, and f) generating at least one reference in the wire data that references the wire segment data.

8. The computer-readable medium of claim 7, wherein the step of e) generating at least one reference in the polygon data that references the wire data includes the step of for each wire represented in the wire segment data, generating a reference in the polygon data to data in the wire data that represents that wire, and the step of f) generating at least one reference in the wire data that references the wire segment data includes for each of the one or more wires generating a reference in the wire data to both the first and last wire segments contained in the wire.

9. The computer-readable medium of claim 6, wherein the directed line segment data indicates for each directed line segment a change in first coordinates for a change in second coordinates, and the sequences of instructions further include instructions for performing the step of generating directed line segment data that indicates for each directed line segment a change in first coordinates for a change in second coordinates.

10. The computer-readable medium of claim 6, wherein the plurality of sequences of instructions includes instructions for performing the step of generating branch data that specifies wire segments associated with connected wires.

11. A method for generating a data representation of an integrated circuit (IC) layout, the method comprising the steps of:

a) generating polygon data associated with a polygon that represents a set of IC devices to be represented by the IC layout, wherein the polygon is represented by one or more wires, each of the one or more wires is represented by one or more wire segments and each of the one or more wire segments is represented by two directed line segments, b) generating wire data that both represents the one or more wires and contains at least one reference to the polygon data, c) generating wire segment data that both represents the one or more wire segments and contains at least one reference to the wire data, and d) generating directed line segment data that represents the two directed line segments for each wire segment and indicates a direction of each directed line segment.

12. The method of claim 11, further including the steps of e) generating at least one reference in the polygon data that references the wire data, and f) generating at least one reference in the wire data that references the wire segment data.

13. The method of claim 12, wherein the step of e) generating at least one reference in the polygon data that references the wire data includes the step of for each wire represented in the wire segment data, generating a reference in the polygon data to data in the wire data that represents that wire, and the step of f) generating at least one reference in the wire data that references the wire segment data includes for each of the one or more wires generating a reference in the wire data to both the first and last wire segments contained in the wire.

14. The method of claim 11, wherein the directed line segment data indicates for each directed line segment a change in first coordinates for a change in second coordinates, and the method further includes the step of generating directed line segment data that indicates for each directed line segment a change in first coordinates for a change in second coordinates.

15. The method of claim 11, further including the step of generating branch data that specifies wire segments associated with connected wires.

16. The method of claim 11, wherein the step of a) generating polygon data associated with a polygon that represents a set of IC devices to be represented by the IC layout further comprises the step of generating polygon data associated with a plurality of polygons that represent a set of IC devices to be represented by the IC layout, wherein each polygon of the plurality of polygons is represented by one or more wires, and the method further includes the step of e) performing a validity check of the polygon data by performing the steps of:

i) selecting a first polygon and a second polygon from the plurality of polygons to be checked, ii) determining the canonical direction from the first polygon to the second polygon, and iii) based upon the canonical direction from the first polygon to the second polygon, determining whether a spacing between the first polygon and the second polygon satisfies a set of predetermined spacing criteria.

17. The method of claim 16, wherein the step of ii) determining the canonical direction from the first polygon to the second polygon includes the steps of 1) selecting a side of the first polygon from one or more previously unselected sides of the first polygon, 2) determining the canonical direction from the selected side of the first polygon to the second polygon, 3) determining, based upon the canonical direction from the selected side of the first polygon to the second polygon, whether the second polygon is on top of or is directly outside the selected side of the first polygon, 4) if the second polygon is on top of or is directly outside the selected side of the first polygon, then determining a canonical direction associated with the selected side of the first polygon, 5) if the second polygon is not on top of and is not directly outside the selected side of the first polygon, then repeating steps 1) through 4) until all of the one or more previously unselected sides of the first polygon have been selected, and 6) if the second polygon is not on top of or directly outside of any of the selected sides of the first polygon, then determining the canonical direction from the first polygon to the second polygon using the canonical direction from two or more of the selected sides to the second polygon.

18. The method of claim 16, further including the step of, if the spacing between the first polygon and the second polygon does not satisfy the set of predetermined spacing criteria, then performing the step of moving the second polygon with respect to the first polygon in a direction that is opposite from the direction of two sides of the first polygon that are closest to the second polygon, causing a separation to be generated between the first polygon and the second polygon to satisfy the predetermined spacing criteria.

19. The method of claim 18, wherein
the method further includes the step of defining an exclusion zone around the first polygon that specifies a separation from the second polygon that satisfies the set of predetermined spacing criteria, and
the step of moving the second polygon with respect to the first polygon in a direction that is opposite from the direction of the two sides of the first polygon that are closest to the second polygon further includes the step of moving the second polygon with respect to the first polygon in a direction that is opposite from the direction of the two sides of the first polygon that are closest to the second polygon, causing the second polygon to be located outside the exclusion zone.

20. The method of claim 16, further including the step of if the spacing between the first polygon and the second polygon does not satisfy the set of predetermined spacing criteria, then changing the size of the second polygon to cause the set of predetermined spacing criteria to be satisfied.

21. The method of claim 16, further including the steps of
determining a size of the first polygon based upon a canonical direction from a first side of the first polygon to a second side of the first polygon, and
if the size of the first polygon does not satisfy a set of size criteria, then moving the second side of the first polygon with respect to the first side of the first polygon to cause the set of size criteria to be satisfied.

22. The method of claim 16, wherein
the step of i) selecting a first polygon and a second polygon from the plurality of polygons to be checked includes the step of selecting a first wire segment and a second wire segment from the plurality of wire segments to be checked,
the step of ii) determining the canonical direction from the first polygon to the second polygon includes the step of determining the canonical direction from the first wire segment to the second wire segment, and
the step of iii) determining whether a spacing between the first polygon and the second polygon satisfies a set of predetermined spacing criteria includes the step of based upon the canonical direction from the first wire segment to the second wire segment, determining whether the spacing between the first wire segment and the second wire segment satisfies the set of predetermined spacing criteria.

23. The method of claim 11, further comprising the step of e) based upon a first wire segment having a left face defined by first and second endpoints and a second wire segment having a left face defined by first and second endpoints, generating polygon output data by performing the step of
if the first endpoint of the left face of the first wire segment is collinear with both the first and second endpoints of the left face of the second wire segment and the second endpoint of the left face of the first wire segment is collinear with the first endpoint of the left face of the second wire segment, then establishing a first left polygon face having a first endpoint defined by the first endpoint of the left face of the first wire segment and a second endpoint defined by the second endpoint of the left face of the second wire segment.

24. The method of claim 11, further comprising the step of e) based upon a first wire segment having a left face defined by first and second endpoints and a second wire segment having a left face defined by first and second endpoints, generating polygon output data by performing the step of
if the second endpoint of the left face of the first wire segment is coincident with the first endpoint of the left face of the second wire segment, then establishing both a first left polygon face having a first endpoint defined by the first endpoint of the left face of the first wire segment and a second endpoint defined by the second endpoint of the left face of the first wire segment and a second left polygon face having a first endpoint defined by the second endpoint of the left face of the first wire segment and a second endpoint defined by the second endpoint of the left face of the second wire segment.

25. A method for determining the canonical direction from a directed line segment to an arbitrary point in an integrated circuit layout, the method comprising the steps of:
a) determining the location of the arbitrary point with respect to a point on the directed line segment;
b) determining the location of the arbitrary point with respect to a first endpoint of the directed line segment; and
c) determining the location of the arbitrary point with respect to a second endpoint of the directed line segment; and
d) based upon the results of steps a) through c), assigning a canonical direction from the directed line segment to the arbitrary point.

26. A method for generating a data representation of an integrated circuit (IC) layout, the method comprising the steps of:
a) generating polygon data associated with a polygon that represents a set of IC devices to be represented by the IC layout, wherein the polygon is represented by one or more wires and the one or more wires is represented by one or more wire segments, wherein each wire segment is represented by four sides, and wherein none of the four sides has a preferred orientation with respect to a reference;

b) generating wire data that both represents the one or more wires and contains at least one reference to the polygon data; and c) generating wire segment data that both represents the one or more wire segments and contains at least one reference to the wire data.

27. The method as recited in claim 26, wherein for each wire segment, none of the four sides must be parallel to any other of the four sides.

28. A computer-readable medium for determining the canonical direction from a directed line segment to an arbitrary point in an integrated circuit layout, the computer-readable medium carrying one or more sequences of one or more instructions which, when executed by one or more processors, cause the one or more processors to perform the steps of:

a) determining the location of the arbitrary point with respect to a point on the directed line segment;

b) determining the location of the arbitrary point with respect to a first endpoint of the directed line segment; and c) determining the location of the arbitrary point with respect to a second endpoint of the directed line segment; and d) based upon the results of steps a) through c), assigning a canonical direction from the directed line segment to the arbitrary point.

29. A computer system for determining the canonical direction from a directed line segment to an arbitrary point in an integrated circuit layout, the computer system comprising:

one or more processors; and a memory communicatively coupled to the one or more processors, the memory including one or more sequences of one or more instructions which, when executed by the one or more processors, cause the one or more processors to perform the steps of a) determining the location of the arbitrary point with respect to a point on the directed line segment, b) determining the location of the arbitrary point with respect to a first endpoint of the directed line segment, c) determining the location of the arbitrary point with respect to a second endpoint of the directed line segment, and d) based upon the results of steps a) through c), assigning a canonical direction from the directed line segment to the arbitrary point.

30. A computer-readable medium for generating a data representation of an integrated circuit (IC) layout, the computer readable medium carrying one or more sequences of one or more instructions which, when executed by one or more processors, cause the one or more processors to perform the steps of:

a) generating polygon data associated with a polygon that represents a set of IC devices to be represented by the IC layout, wherein the polygon is represented by one or more wire more wires and the one or more wires is represented by one or more wire segments, wherein each wire segment is represented by four sides, and wherein none of the four sides has a preferred orientation with respect to a reference;

b) generating wire data that both represents the one or more wires and contains at least one reference to the polygon data; and c) generating wire segment data that both represents the one or more wire segments and contains at least one reference to the wire data.

31. The computer-readable medium as recited in claim 30, wherein for each wire segment, none of the four sides must be parallel to any other of the four sides.

32. A computer system for generating a data representation of an integrated circuit (IC) layout comprising:

one or more processors; and a memory communicatively coupled to the one or more processors, wherein the memory include one or more sequences of one or more instructions which, when executed by the one or more processors cause the one or more processors to perform the steps of a) generating polygon data associated with a polygon that represents a set of IC devices to be represented by the IC layout, wherein the polygon is represented by one or more wires and the one or more wires is represented by one or more wire segments, wherein each wire segment is represented by four sides, and wherein none of the four sides has a preferred orientation with respect to a reference;

b) generating wire data that both represents the one or more wires and contains at least one reference to the polygon data; and c) generating wire segment data that both represents the one or more wire segments and contains at least one reference to the wire data.

33. The computer system as recited in claim 32, wherein for each wire segment, none of the four sides must be parallel to any other of the four sides.

* * * * *